(12) United States Patent
Suzuki

(10) Patent No.: US 7,847,644 B2
(45) Date of Patent: Dec. 7, 2010

(54) MODULATION SIGNAL GENERATION CIRCUIT, TRANSMISSION/RECEPTION MODULE, AND RADAR DEVICE

(75) Inventor: Takuya Suzuki, Tokyo (JP)

(73) Assignee: Mitsubishi Electric Corporation, Tokyo (JP)

(*) Notice: Subject to any disclaimer, the term of this patent is extended or adjusted under 35 U.S.C. 154(b) by 295 days.

(21) Appl. No.: 12/096,951

(22) PCT Filed: Jul. 21, 2006

(86) PCT No.: PCT/JP2006/314517

§ 371 (c)(1),
(2), (4) Date: Jun. 11, 2008

(87) PCT Pub. No.: WO2008/010298

PCT Pub. Date: Jan. 24, 2008

(65) Prior Publication Data

US 2009/0224845 A1    Sep. 10, 2009

(51) Int. Cl.
*G01R 23/00* (2006.01)
*H03B 5/12* (2006.01)
*H03B 5/18* (2006.01)
*H03C 3/00* (2006.01)
*H03C 3/22* (2006.01)

(52) U.S. Cl. .................. 331/66; 331/44; 331/117 R; 331/117 D; 331/177 V; 332/130; 332/136

(58) Field of Classification Search .............. 331/23, 331/36 C, 44, 65, 66, 116 R, 116 FE, 117 R, 331/117 FE, 117 D, 176, 177 R, 177 V; 332/126–130, 332/135, 136
See application file for complete search history.

(56) References Cited

U.S. PATENT DOCUMENTS

| 6,677,788 B2 * | 1/2004 | Miyagawa et al. | 327/156 |
| 7,005,936 B2 * | 2/2006 | Tanzawa | 331/176 |

FOREIGN PATENT DOCUMENTS

| JP | 6 41223 | 5/1994 |
| JP | 8 146 125 | 6/1996 |
| JP | 2002 62355 | 2/2002 |
| JP | 2004 166076 | 6/2004 |
| JP | 02006292651 A * | 10/2006 |

* cited by examiner

*Primary Examiner*—David Mis
(74) *Attorney, Agent, or Firm*—Oblon, Spivak, McClelland, Maier & Neustadt, L.L.P.

(57) ABSTRACT

A modulation-signal generating circuit includes a temperature monitoring unit that detects a casing temperature of the circuit, a voltage control oscillator including two variable impedance circuits that independently control oscillation frequency based on an input control voltage, a frequency-correction-voltage generating unit that outputs a voltage for compensating for a temperature drift of an oscillation frequency according to the casing temperature detected by the temperature monitoring unit, to one of the variable impedance circuits, and an FM-modulation-voltage generating unit that outputs a modulation voltage containing a constant DC component not depending on temperature and a predetermined AC component, to the other variable impedance circuit, under a temperature drift compensation condition of the frequency-correction-voltage generating unit.

13 Claims, 18 Drawing Sheets

BEAT SIGNAL

US 7,847,644 B2

MODULATION SIGNAL GENERATION CIRCUIT, TRANSMISSION/RECEPTION MODULE, AND RADAR DEVICE

TECHNICAL FIELD

The present invention relates to a modulation-signal generating circuit of a transmission/reception module mounted on a radar device that measures a distance and a speed with respect to a target object, and more particularly, to a modulation-signal generating circuit that outputs a frequency-modulated wave by a voltage control oscillator in a microwave band, a millimeterwave band, and the like.

BACKGROUND ART

An FM-CW radar has long been used as a radar that calculates a distance and a relative speed between a vehicle and a vehicle in front. The radar emits a frequency-modulated (FM-modulated) signal wave to a target object, detects a mixed wave (beat signal) of a reflection wave from the target object and a transmission wave, and extracts a delay time and a Doppler shift, thereby calculating a distance and a relative speed between the target object and the vehicle.

FIG. 14 is a schematic configuration diagram of a general transmission/reception module and a modulation-signal generating circuit mounted on the above FM-CW radar. The modulation-signal generating circuit includes a voltage control oscillator (VCO) 41 that changes an oscillation frequency according to a control voltage, an FM-modulation-voltage generating unit 42 that inputs a control voltage to the VCO, a modulation-signal generating circuit 40 including the VCO 41 and the FM-modulation-voltage generating unit 42, a transmitting unit 5 that transmits a signal output from the VCO, branches a part of the transmission signal, and outputs the transmission signal, and a receiving unit 6 that extracts a mixed wave of a reflection signal from the target and a divided signal.

The measurement precision when the above transmission/reception module is applied to a distance/speed measuring radar depends on linearity of an FM-modulated signal emitted from the modulation-signal generating circuit 40, that is, modulation linearity of the oscillation signal of the VCO 41. However, it has been difficult, from the cost and technical viewpoint, to obtain high linearity of VCO on the FM-modulation voltage-frequency characteristic ($V_T$-f characteristic).

This kind of VCO requires a predetermined frequency modulation width on a radar system. Therefore, a VCO is structured to have a low setting of a Q value of a tuning circuit, in many cases, and a temperature variation of an semiconductor element at the oscillation circuit side gives a relatively large influence. As a result, a temperature drift of the output frequency of the VCO becomes large, and the $V_T$-f characteristic changes to a frequency axis direction at an ambient temperature.

FIG. 15-1 depicts a general $V_T$-f characteristic, where A denotes a characteristic at a normal temperature, B denotes a characteristic at a high temperature, and C denotes a characteristic at a low temperature. At the normal temperature, the VCO 41 oscillates at a center voltage $V_A$ of an FM modulation voltage $V_T$, at an amplitude of $\Delta V_A$ (operation point $P_A$), and outputs an FM-modulated wave of a frequency modulation width $\Delta f_A$. When the ambient temperature increases or decreases, the above operation point shifts to $P_B$ and $P_C$, and an FM-modulated wave (range of $\Delta f_B$ and $\Delta f_C$) output from the VCO 41 exceeds a legal frequency range of the Radio Law.

Therefore, conventionally, as shown in FIG. 15-2, the operation point is shifted to a horizontal direction at the ambient temperature, and operation is performed at operation points $P_A$, $P'_B$, and $P'_C$, at each of the normal temperature, the high temperature, and the low temperature, thereby avoiding the above problems. Patent Document 1 mentioned below discloses a conventional technique of constituting the above conventional FM-CW radar device by a modulation voltage circuit that adds the FM modulation voltage, by independently generating a modulation voltage (AC component) and a DC offset voltage controlled at the temperature of the module.

The gradients (modulation sensitivities) of the $V_T$-f characteristics A, B, and C of the VCO 41 at the above operation points $P_A$, $P'_B$, and $P'_C$ are different. Therefore, when the same FM modulation voltage (the AC component) is input, the frequency modulation width $\Delta f$ changes at the ambient temperature, and the beat frequency of the radar device changes. Consequently, a relative distance R from and a relative speed v of the target object cannot be measured accurately.

As a method of solving the above problems, a method of compensating for nonlinearity of the voltage-frequency characteristic ($V_T$-f characteristic) at the control voltage is used. That is, a method of applying an inverse draft of the above $V_T$-f characteristic to the FM modulation voltage output from the FM-modulation-voltage generating unit 42 is used.

FIG. 16 depicts a relationship between a modulation voltage-modulation frequency characteristic (curve F) of the VOC 41 and a time-modulation voltage (correction voltage, curve G) that linearizes the curve F. As an FM modulation linearization technique of the VCO, the Patent Document 2 mentioned below discloses a modulation-signal generating circuit that stores voltage data for correcting the $V_T$-f characteristic in a memory in advance, and reads this data as digital data in a constant cycle, thereby obtaining an analog signal output via a D/A converter and an integration circuit.

Patent Document 1: Japanese Patent Application Laid-open No. H8-146125 (see paragraphs 9 to 18, FIG. 1 and FIG. 4)

Patent Document 2: Japanese Patent Application Laid-open No. 2002-62355 (see FIG. 2 and FIG. 7)

DISCLOSURE OF INVENTION

Problem to be Solved by the Invention

However, the setting of a high-precision FM modulation voltage (correction voltage) actually requires an enormous amount of tests and adjustments. That is, the oscillation frequency of the VCO 41 described in the conventional techniques changes at random for each manufacturing lot and for each manufacturing process, due to a variation of semiconductors particularly remarkable in a high-frequency circuit of a microwave and a millimeterwave band. As a result, the voltage-frequency characteristic ($V_T$-f characteristic) shown in FIG. 15-2 changes in a vertical axis direction (frequency-axis direction). Therefore, in obtaining a predetermined FM-modulated wave within a legal frequency range, the operation point P needs to be changed and set for each VCO. Because the modulation sensitivity of each VCO changes due to the change of this operation point, the FM modulation correction voltage to be corrected also needs to be set individually to match this modulation sensitivity. Consequently, an enormous amount of test and adjustment time is necessary for each radar device mounted with this circuit.

As described above, when the operation point is shifted to a horizontal direction (when the DC offset of the modulation voltage is changed at each temperature) to avoid the output of the FM-modulated wave outside the legal frequency range due to a temperature drift, the modulation sensitivity changes greatly, such as up to 1.5 times at a low temperature and up to 0.8 times at a high temperature, of the modulation sensitivity at the normal temperature, as shown in FIG. 15-2. To compensate for this temperature change of the modulation sensitivity, a data table having a large amount of temperature compensation data is necessary. This temperature compensation data also requires an enormous amount of test and adjustment time, because of a change of an FM-modulation voltage compensation amount due to the individual variation of the VCO 41 (that is, the variation of the operation point=modulation sensitivity). Consequently, a mass production is difficult.

The present invention has been made in the light of the above problems. It is an object of the present invention to simplify the temperature data of the modulation correction voltage to obtain modulation linearity of the output signal from the voltage control oscillator.

It is another object of the invention to substantially decrease the test and adjustment time.

Means for Solving Problem

A modulation-signal generating circuit according to the present invention outputs a transmission wave in which a frequency changes periodically and linearly with time. The modulation-signal generating circuit includes a temperature monitoring unit that detects a temperature of a casing of the circuit; a voltage control oscillator including two variable impedance circuits that independently control oscillation frequency based on an input control voltage; a frequency-correction-voltage generating unit that outputs a voltage for compensating for a temperature drift of the oscillation frequency according to the temperature detected by the temperature monitoring unit, for one of the variable impedance circuits; and an FM-modulation-voltage generating unit that outputs a modulation voltage containing a temperature-independent constant DC component and a predetermined AC component, for other of the variable impedance circuits, under a temperature drift compensation condition set by the frequency-correction-voltage generating unit.

Furthermore, a transmission/reception module can be configured, which transmits and receives an FM-modulations wave, and outputs a beat signal from a mixed wave of a transmission wave and a reception wave, by employing the modulation-signal generating circuit.

Moreover, a radar device can be configured, which calculates a relative distance and a relative speed between a target object and the own device by transmitting and receiving an FM-modulations wave and processing a beat signal obtained from a mixed wave of a transmission wave and a reception wave, by employing the modulation-signal generating circuit.

Effect of the Invention

According to the present invention, a temperature compensation of the output frequency of the voltage control oscillator can be achieved independently of the frequency modulation. Therefore, the modulation operation point of the voltage control oscillator does not need to be changed at each temperature due to the constraint of the legal frequency range. Consequently, the FM modulation can be performed at the operation point at which the modulation sensitivity of the voltage control oscillator does not change at temperatures. The test and adjustment time can be decreased substantially.

BRIEF DESCRIPTION OF DRAWINGS

FIG. 3-1 is a circuit diagram of another configuration example of the voltage control oscillator (having a variable impedance circuit connected to a base side of an semiconductor element) according to the present invention.

FIG. 3-2 is a circuit diagram of another configuration example of the voltage control oscillator (having a variable impedance circuit connected to a collector side of an semiconductor element) according to the present invention.

FIG. 3-3 is a circuit diagram of another configuration example of the voltage control oscillator (having a variable impedance circuit connected to an emitter side of an semiconductor element) according to the present invention.

FIG. 4-1 depicts a $V_T$-f characteristic (temperature characteristic) when a frequency compensation voltage of the modulation-signal generating circuit according to the present invention is not temperature-compensated for.

FIG. 4-2 depicts a $V_T$-f characteristic (normal-temperature characteristic) when a frequency compensation voltage of the modulation-signal generating circuit according to the present invention is changed.

FIG. 4-3 depicts a $V_T$-f characteristic (temperature characteristic) when a frequency compensation voltage of the modulation-signal generating circuit according to the present invention is temperature-compensated for.

FIG. 7-1 is a graph of a relationship between a $V_T$-f characteristic of a VCO and a time-modulation voltage (correction voltage) for linearizing an output frequency according to the present invention.

FIG. 7-2 is a graph of a detail of a waveform at a C part on a curve B shown in FIG. 7-1.

FIG. 9-1 depicts a data table of an FM modulation voltage and a frequency compensation voltage at each temperature stored in a memory.

FIG. 9-2 is a graph of a time waveform of an FM modulation voltage stored in a memory.

FIG. 9-3 is a graph of a time waveform of a frequency compensation voltage stored in a memory.

FIG. 11-1 is a flowchart of a procedure of generating FM-modulated data according to the present invention.

FIG. 11-2 is a flowchart of a procedure of generating frequency correction data performed following the flow of FIG. 11-1.

FIG. 15-1 depicts a $V_T$-f characteristic (temperature characteristic) of a conventional transmission/reception module.

FIG. 15-2 depicts a $V_T$-f characteristic (temperature characteristic) and operation points at each of the normal temperature, the high temperature, and the low temperature of a conventional transmission/reception module.

EXPLANATIONS OF LETTERS OR NUMERALS

Figure 1:
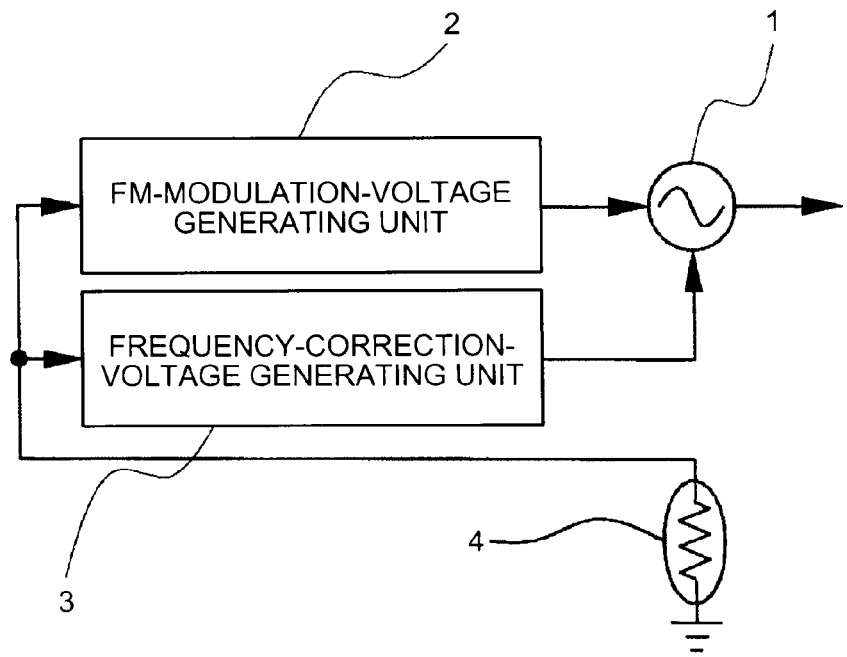
FIG. 1 is a block diagram of a basic configuration of a modulation-signal generating circuit according to the present invention.

1 Voltage control oscillator (VCO)
2 FM-modulation-voltage generating unit
3 Frequency-correction-voltage generating unit
4 Temperature monitoring unit
5 Transmitting unit
6 Receiving unit
7 Microcomputer
8a to 8c Memory
9 A/D converter
10 Data control unit
11 Oscillation circuit unit
12 Tuning circuit unit
13 Variable impedance circuit
14 Variable impedance circuit (Variable LC series resonator)
15 VCO RF output terminal
16 Frequency correction terminal
17 FM modulation terminal
18 Main resonator (LC series resonator)
19 Variable impedance circuit
21 FM-modulation-voltage D/A converter
31 Frequency-compensation-voltage D/A converter
40 Conventional modulation-signal generating circuit
41 Conventional voltage control oscillator (VCO)
42 FM-modulation-voltage generating unit
50 Transmission antenna
60 Receiving antenna
70 Modulation-signal generating circuit
80 Signal processing unit
91 FM-modulation voltage data
92 Time interval data
93 Frequency-compensation voltage data
101 Semiconductor element
102 Reflection circuit
103 Output-side phase line
104 Input-side phase line
105 Ground inductor
106, 107 Varactor diode
108, 109 Inductance
110, 111 Bypass capacitor
112, 113 Stabilization resistor
114 Bypass capacitor
115 Choke coil
116 Ground capacitor
201 Capacitor
202 Inductance

BEST MODE(S) FOR CARRYING OUT THE INVENTION

Exemplary embodiments of a modulation-signal generating circuit according to the present invention will be explained below in detail with reference to the accompanying drawings. Note that the invention is not limited to the embodiments.

First Embodiment

Figure 2:
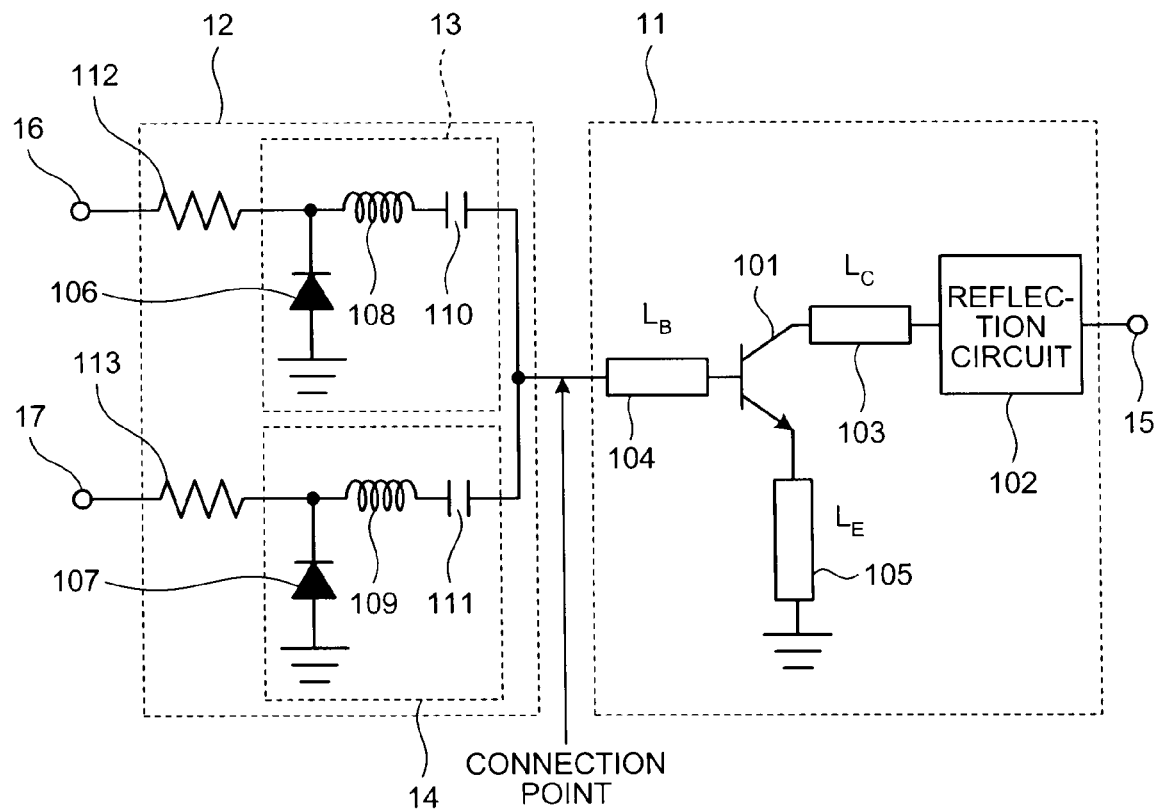
FIG. 2 is a circuit diagram of a representative configuration example of a voltage control oscillator according to the present invention.

FIG. 1 is a block diagram of a basic configuration of a modulation-signal generating circuit according to the present invention, and FIG. 2 is a representative configuration example of a VCO 1. The circuit configuration represents one example of a configuration including a VCO and its control circuit having a frequency-adjustable impedance variable circuit separately from an FM modulation impedance variable circuit. The circuit configuration is not limited to this when the circuit has a function equivalent to that of an optional self-run oscillator that can be controlled by voltage.

In FIG. 1, the modulation-signal generating circuit includes a voltage control oscillator (VCO) 1, an FM-modulation-voltage generating unit 2, a frequency-correction-voltage generating unit 3, and a temperature monitoring unit 4. The voltage control oscillator (VCO) 1 has two independent frequency control terminals. The FM-modulation-voltage generating unit 2 generates an FM modulation voltage that periodically changes at a predetermined voltage width around a predetermined DC component, and inputs the FM modulation voltage to one VCO. The frequency-correction-voltage generating unit 3 outputs a frequency compensation voltage to the other frequency control terminal according to the ambient temperature independently of the above FM-modulation-voltage generating unit. The temperature monitoring unit 4 detects the ambient temperature of the circuit.

The VCO 1 outputs an FM modulation signal having a predetermined modulation width, according to the FM modulation voltage including a constant DC component not depending on temperature from the FM-modulation-voltage generating unit 2 and an AC component for performing a predetermined frequency modulation, and the frequency compensation voltage from the frequency-correction-voltage generating unit 3 given according to the casing temperature detected by the temperature monitoring unit 4.

FIG. 2 is explained next. FIG. 2 depicts a VCO that operates mainly in a microwave and a millimeterwave band. An electric part of a lumped constant such as a capacitor and a coil has a constraint on installation, following high frequency of parasitic inductance and capacitance of a lead and an electrode. Therefore, a reflection-resonance type oscillator of a distribution constant circuit is taken up as an example. Accordingly, plural configurations are considered for a circuit system and a part used, depending on a frequency band used. A configuration of the oscillator to which the present invention can be applied is not limited to this.

In FIG. 2, the VCO 1 includes an oscillation circuit unit 11 and a tuning circuit unit 12. The VCO 1 satisfies an oscillation condition and starts oscillation, in a frequency that satisfies conditions that a sum of reflection gains of the oscillation circuit unit 11 and the tuning circuit unit 12 at their connection point is larger than zero and that a reflection phase is zero.

The oscillation circuit unit 11 includes an semiconductor element 101, a reflection circuit 102, an output-side phase line 103, an input-side phase line 104, and a ground inductor 105. The oscillation circuit unit 11 feedback amplifies in an operation frequency, and obtains necessary reflection gain and a phase condition. For the semiconductor element 101, there are used a three-terminal transistor having gain in the oscillation frequency zone such as an FET (Field Effect Transistor) and an HBT (Heterojunction Bipolar Transistor), and a diode (Gun diode, IMPATT diode, and resonance tunneling diode (RTD)) having negative resistance. Phase noise of the VCO1 gives large influence to the radar S/N. To improve this phase noise characteristic, 1/f noise characteristic of the semiconductor element 101 used in the oscillation circuit unit 11 becomes an important factor, and the semiconductor element 101 is selected because of the necessary gain. The input-side phase line 104 and the ground inductor 105 are connected to a base and an emitter terminal of the semiconductor element 101, respectively. A series circuit of the output-side phase line 103 and the reflection circuit 102 is connected to a collector terminal of the semiconductor element 101, thereby forming necessary reflection gain and a phase condition. A power supply circuit of the semiconductor element 101 of the oscillation circuit unit 11 is complex, and is omitted from the diagram.

The tuning circuit unit 12 includes two variable impedance circuits 13 and 14. The variable impedance circuits 13 and 14 include varactor diodes 106 and 107 and inductances 108 and 109, respectively, and form variable LC series resonators, respectively. Bypass capacitors 110 and 111 are connected in series to the inductances 108 and 109, respectively. A frequency correction terminal 16 and an FM modulation terminal 17 constitute a frequency control terminal. The frequency correction terminal 16 and the FM modulation terminal 17 are connected to the varactor diodes 106 and 107, via stabilization resistors 112 and 113, respectively, thereby inputting a control voltage. A frequency compensation voltage and an FM modulation voltage are input as control voltages, to the frequency correction terminal 16 and the FM modulation terminal 17, respectively.

Impedance becoming a connection point between the variable impedance circuits 13 and 14, that is, impedance of a parallel circuit, is designed to be open in the operation frequency. In this case, an opened frequency, that is, a resonance frequency, is determined by a tuning frequency of an LC series resonator constituted by the variable impedance circuits 13 and 14. Therefore, by controlling the capacitance of the variable impedance circuits 13 and 14, that is, the input voltage of each of the terminals 16 and 17, the oscillation frequency of a signal output from an RF output terminal 15 of the VCO 1 can be controlled.

That is, when the two varactor diodes are held as described above, the impedance of the variable impedance circuits (variable LC series resonators) 13 and 14 changes. Therefore, the oscillation frequency of the VCO 1 can be independently controlled by the control voltage connected to the two varactor diodes.

Figure 15A:
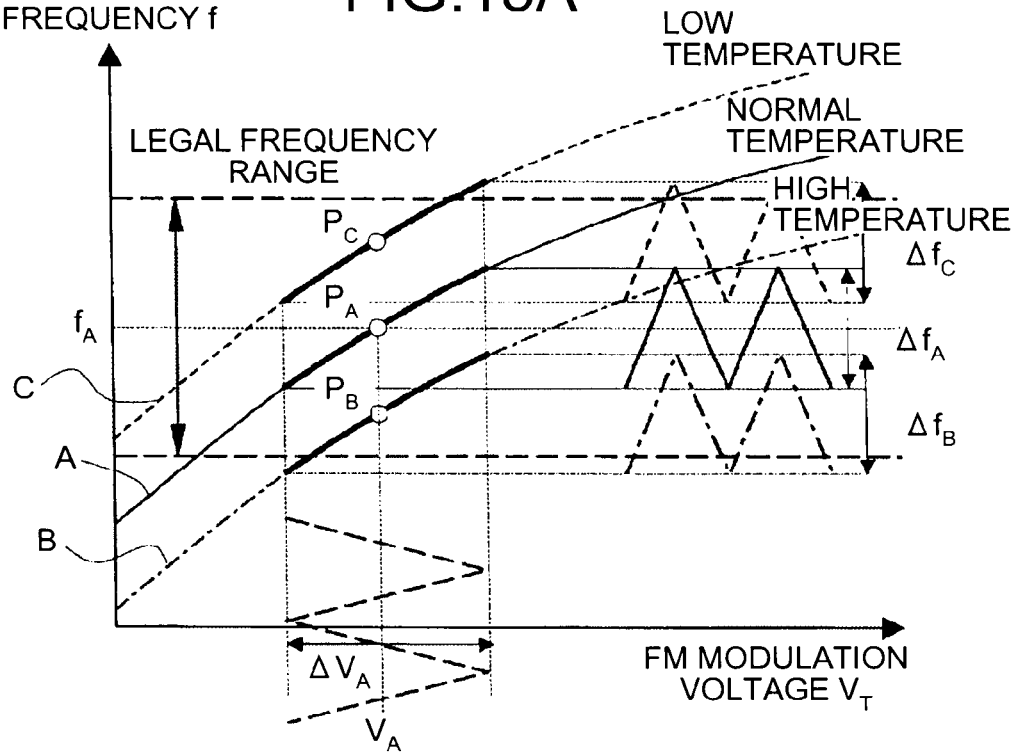
Figure 15B:
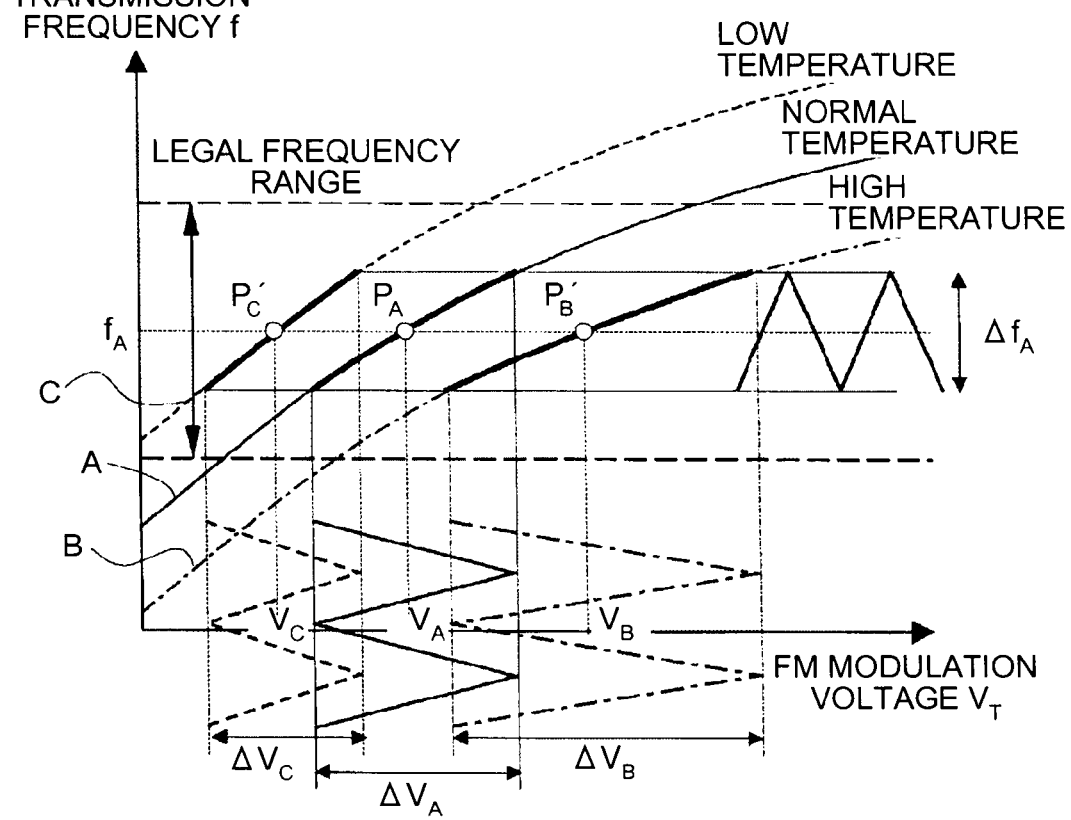
Figure 16:
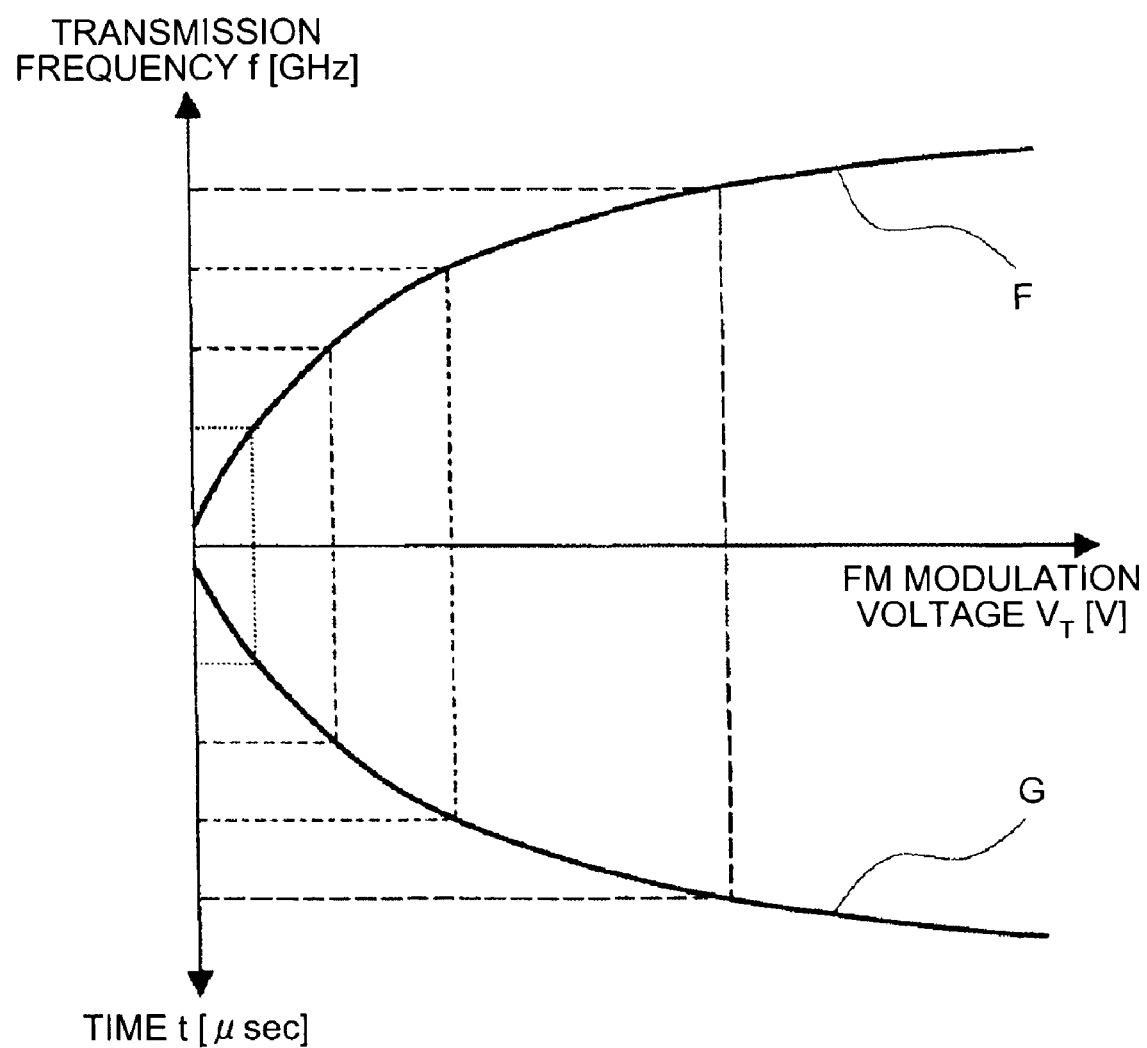
FIG. 16 is a graph of a relationship between a $V_T$-f characteristic and a time-modulation voltage (correction voltage) for linearizing an output frequency of a general VCO.

When the same control voltage is simultaneously applied to the two or more control terminals, a total frequency change width as a sum of frequency change widths at these control voltages is obtained. The above two control voltages become opposite-direction voltages applied to the varactor diodes 106 and 107, and accordingly, barrier capacitance of the varactor diodes changes. However, in general, a capacitance value does not change linearly at the control voltage (to obtain linearity, generation a special connection structure of a diode is necessary). That is, the oscillation frequency does not change linearly at each of the control voltages, and a curved control voltage-frequency characteristic ($V_T$-f characteristic) similar to the conventional curve as shown in FIG. 15 is obtained.

Figures 1, 3:
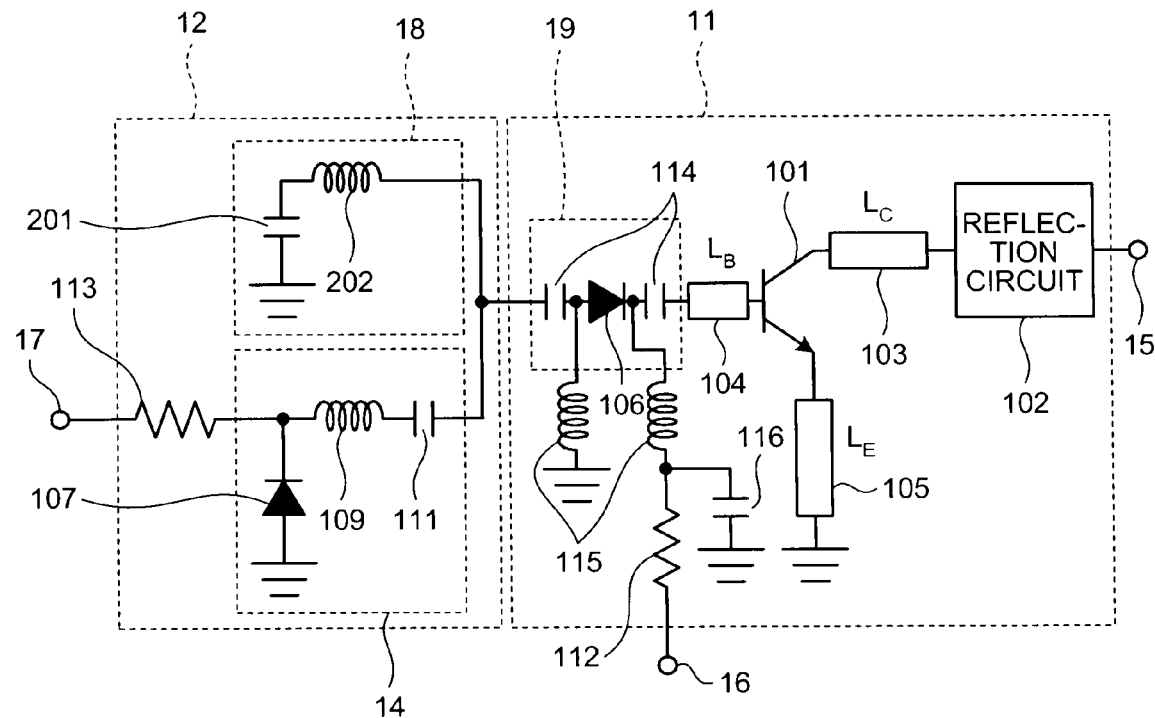
Figures 2, 3:
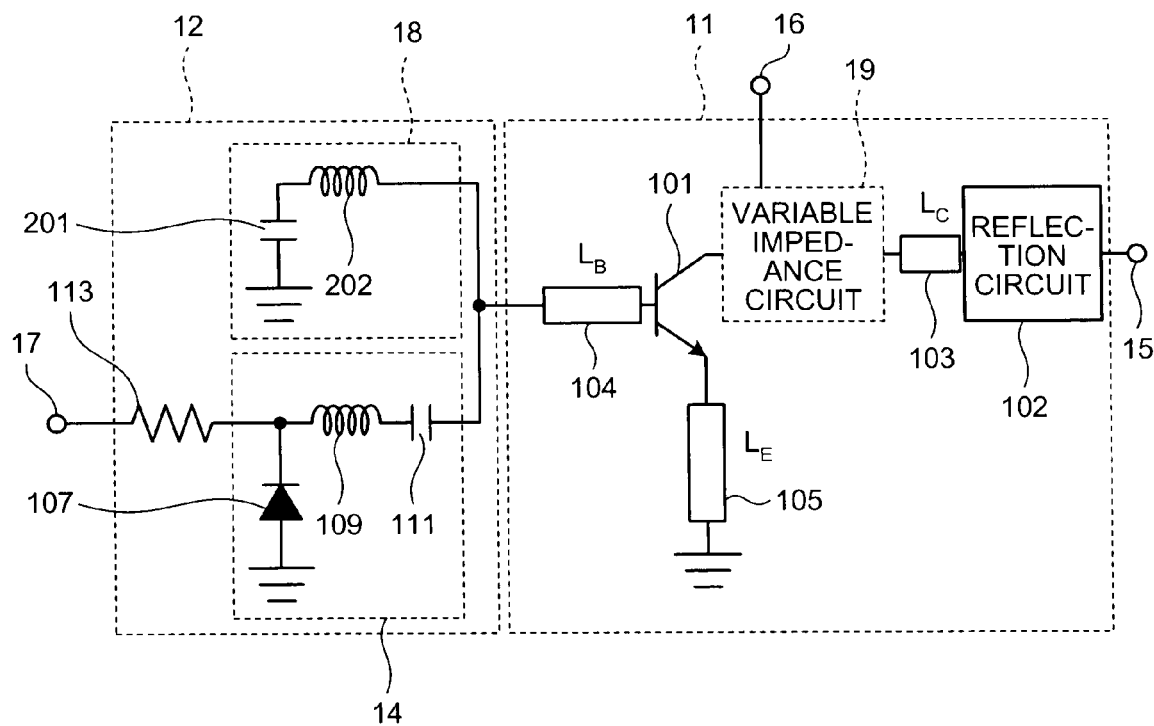
Figure 3:
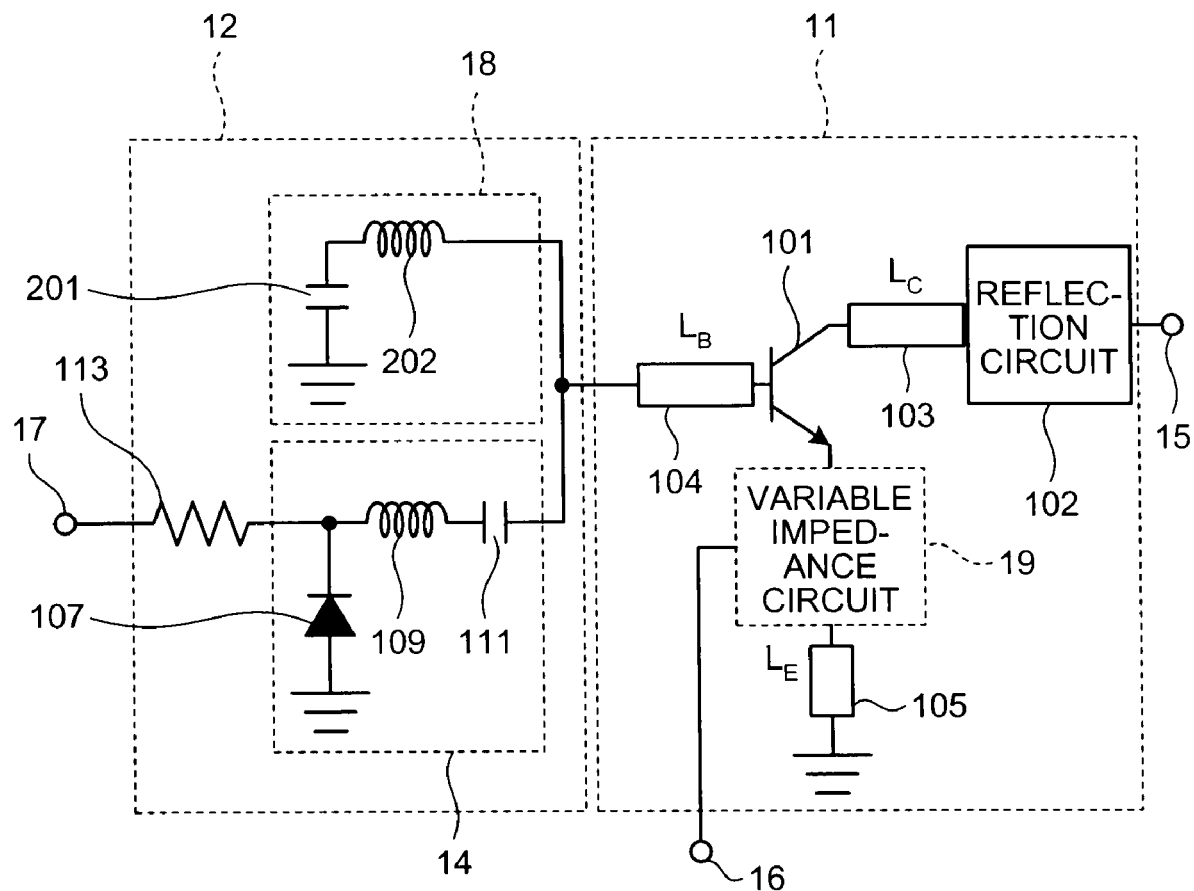

A configuration of the voltage control oscillator having the above two impedance variable circuits is not limited to that shown in FIG. 2. FIG. 3 is another configuration example of a voltage control oscillator having two impedance variable circuits (variable phase circuits).

While the VCO shown in FIG. 2 has two impedance variable circuits (variable LC series resonators) within the tuning circuit unit 12, one variable impedance circuit (variable phase circuit) can be provided in the tuning circuit unit 12, and the other variable impedance circuit can be held in the output-side phase line 103, the input-side phase line 104, or the ground inductor 105 of the oscillation circuit unit 11, as shown in FIG. 3-1, FIG. 3-2, and FIG. 3-3, for example. In FIG. 3-1 to FIG. 3-3, circuits having the same objects as those of the circuits shown in FIG. 2 are denoted by like reference numerals.

In FIG. 3-1 to FIG. 3-3, a variable impedance circuit 19 has the varactor diode 106, and bypass capacitors 114 (not shown in FIG. 3-2 and FIG. 3-3) are connected to both ends of the varactor diode 106. Choke coils 115 are connected to between the varactor diode 106 and the bypass capacitors 114. The choke coil 115 connected to the cathode side of the varactor diode 106 is connected to the frequency correction terminal 16 via the ground capacitor 116 and the series resistor 112, and the choke coil 115 connected to the anode side is grounded.

One of parallel resonance circuits of the tuning circuit unit 12 includes a main resonator 18. The main resonator 18 includes a series circuit of a grounded capacitor 201 and an inductance 202. Impedance of the parallel circuit combined with the variable LC resonator 14 is selected to be open in the operation frequency.

Note that it is essential to have an impedance variable circuit that compensates for a temperature variation (phase variation) of an semiconductor element without changing the operation current (bias condition) of the semiconductor element within the oscillation circuit unit 11, separately from the FM-modulation impedance variable circuit (variable LC resonator).

FIG. 3-1 is an example that the variable impedance circuit 19 is connected to a base side of the semiconductor element 101, FIG. 3-2 is an example that the variable impedance circuit 19 is connected to a collector side of the semiconductor element 101, and FIG. 3-3 is an example that the variable impedance circuit 19 is connected to an emitter side of the semiconductor element 101.

Figures 1, 4:
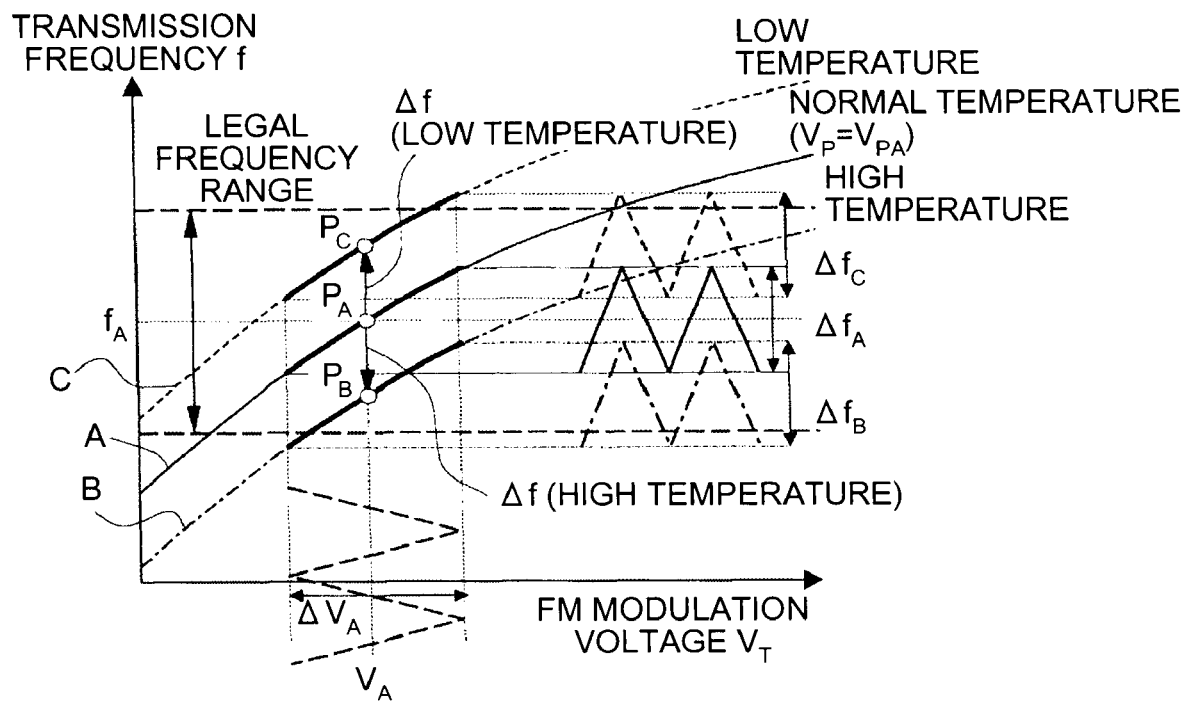
Figures 2, 4:
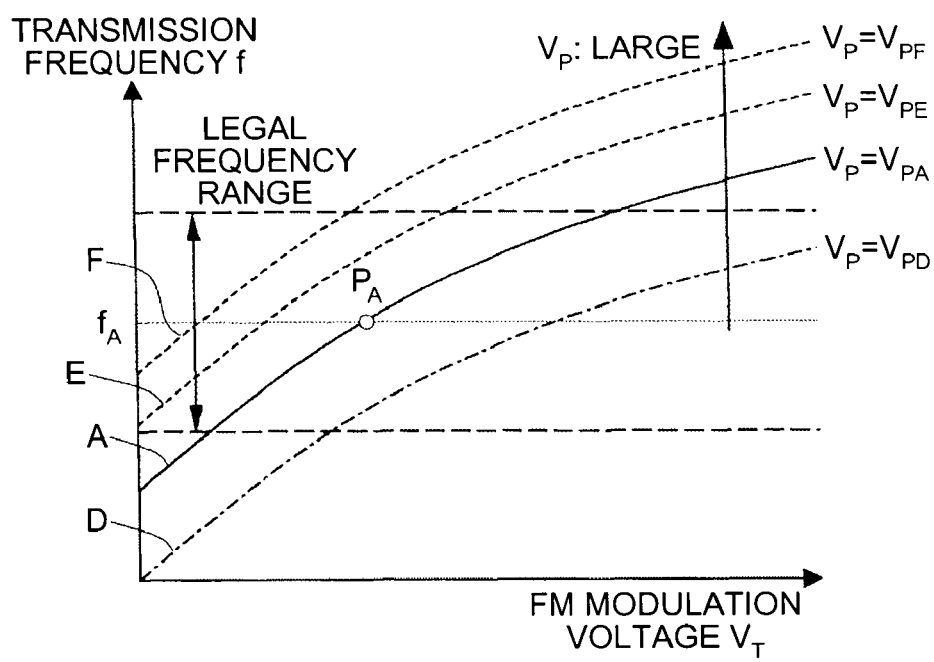
Figures 3, 4:
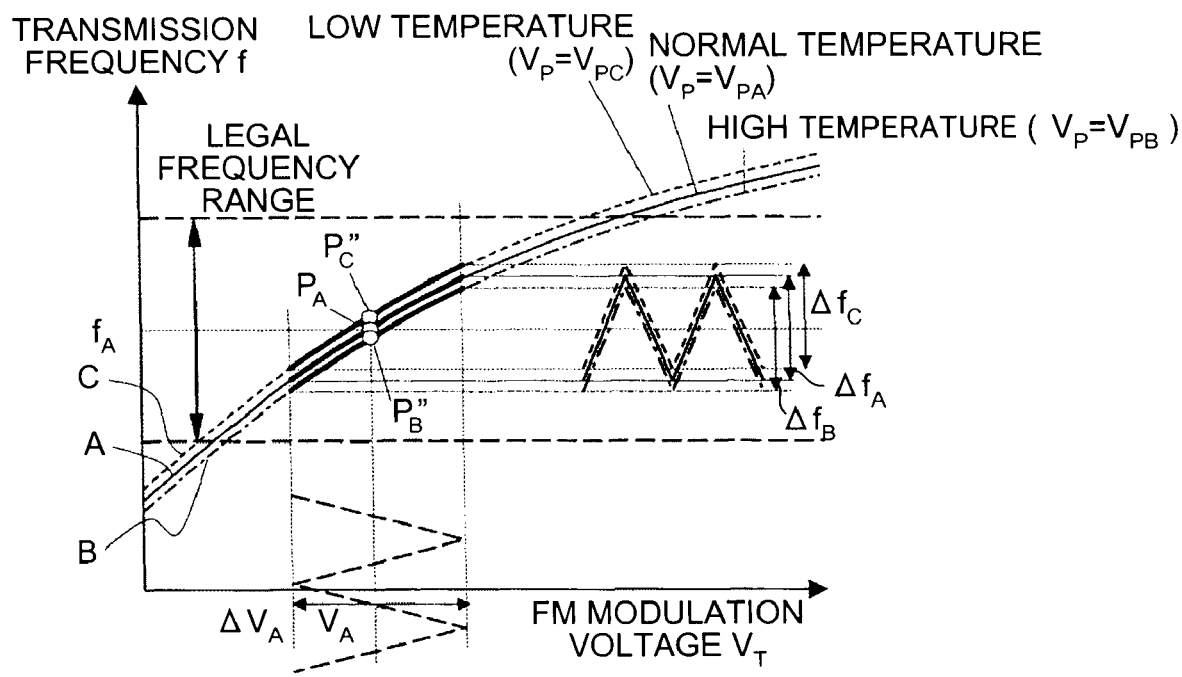

Operation of the modulation-signal generating circuit according to the present invention is explained next. FIG. 4 depicts a relationship among an FM modulation voltage, a frequency compensation voltage, and an output frequency of the VCO 1. The FM-modulation-voltage generating unit 2 inputs the center voltage $V_A$, and the FM modulation voltage $V_T$ of the amplitude $\Delta V_A$ to the varactor diodes 107 within the VCO 1. The frequency-correction-voltage generating unit 3 inputs a frequency compensation voltage $V_{PA}$ to the other varactor diode 106.

When the above two control voltages (FM modulation voltage, frequency compensation voltage) are applied, the VCO 1 oscillates at the operation point $P_A$ in a curve A of the FM modulation voltage-output frequency characteristic (hereinafter, $V_T$-f characteristic) shown in FIG. 4-1, at the normal temperature, and outputs the FM modulation wave of a center frequency $f_A$, and an FM modulation wave of a frequency modulation width $\Delta f_A$. In FIG. 4-1, a voltage $V_T$ in the lateral axis denotes the FM modulation voltage input from the FM-modulation-voltage generating unit 2.

At the high temperature and the low temperature, the output frequency of the VCO 1 temperature-drifts. Therefore, when the frequency compensation voltage $V_{PA}$ is at a constant voltage, the $V_T$-f characteristic changes to a frequency axis direction, and the above operation point $P_A$ shifts to $P_B$, and $P_C$ points on the characteristics B and C. Consequently, the FM modulation wave (range of the frequency modulation widths $\Delta f_B$ and $\Delta f_C$) exceeds the legal frequency range of the Radio Law.

A temperature drift of the oscillation frequency of the VCO 1 becomes an oscillation drift of 3 to 4 MHz/° C. at a change of the ambient temperature, depending on the modulation sensitivity of the VCO (change rate of the oscillation frequency at the FM modulation voltage), when the output frequency of the VOC is set to a 38 GHz band. When the ambient temperature changes within a range of −30° C. to 85° C., the oscillation frequency of the VCO varies by about 345 to 460 megahertz. When the VCO is applied to a 77 GHz-band transmission/reception module for the FM-CW radar, for example, the frequency variation is doubled to a range of 690 to 920 megahertz.

Characteristics of the semiconductor element of the oscillation circuit unit and the variable capacitance element of the tuning circuit unit respectively vary depending on the semiconductor manufacturing process and individual variation. Therefore, the oscillation frequency of the VCO also varies consequently. The variation amount depends on the circuit configuration, and becomes about 600 to 700 megahertz that is equal to or more of the above temperature drift, considering a variation among manufacturing lots. Therefore, when the temperature drift and the individual variation of the oscillation frequency of the VCO are considered, the variation amount easily exceeds the legal frequency range 76 to 77 gigahertz of the 77 GHz-band low-power radar.

The output frequency changes when the frequency compensation voltage Vp changes. When the $V_{PA}$ is changed at the normal temperature, the $V_T$-f characteristic changes in a vertical axis direction (curves D, E, F), as shown in FIG. 4-2. The curves D, E, F also change in the vertical axis direction at the ambient temperature, like the curve A shown in FIG. 4-1. The frequency compensation voltage that can be controlled independently of the FM modulation voltage is used, and the frequency compensation voltage Vp from the frequency-correction-voltage generating unit 3 is changed according to the casing temperature T detected by the temperature monitoring unit 4, thereby controlling the capacitance value of the varactor diode 106, and changing the impedance of the parallel resonator 13. With this arrangement, the temperature variation of the impedance at the oscillation circuit side is compensated for. Based on this compensation, the $V_T$-f characteristic of the VCO 1 is controlled to a direction opposite to the direction of variation by the temperature drift (shifted to the frequency axis direction). As a result, at each of the high temperature and the low temperature, the output frequency near the output frequency at the normal temperature can be obtained (operation at operation points $P_B''$ and $P_C''$ near the operation point $P_A$ at the normal temperature). In FIG. 4-3, the center voltage $V_A$ of the FM modulation equivalent at each of the high temperature, the low temperature, and the normal temperature can be given. Therefore, the frequency modulation widths $\Delta f_A$, $\Delta f_B$, and $\Delta f_C$ become approximately equal, and the FM modulation can be performed in the $V_T$-f characteristic, that is, at the operation point at which the modulation sensitivity becomes approximately constant within the operation temperature range.

Figure 5:
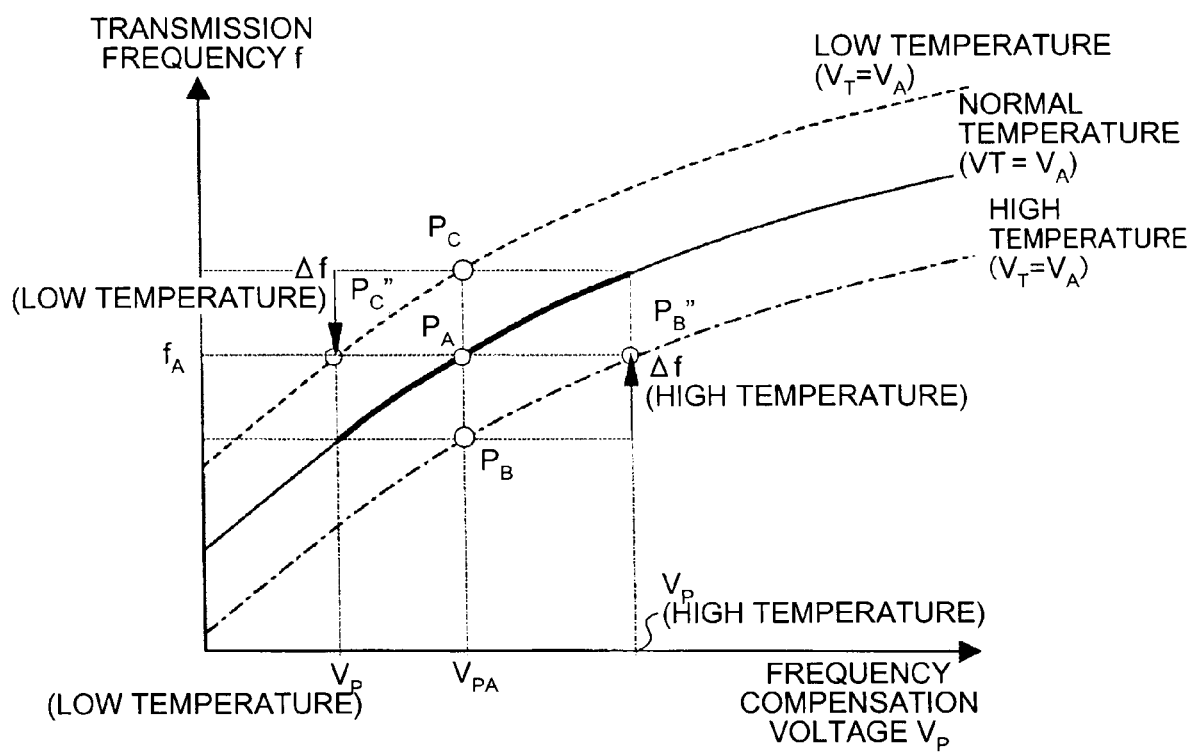
FIG. 5 depicts a Vp-f characteristic (temperature characteristic) of the modulation-signal generating circuit according to the present invention.

FIG. 5 depicts a characteristic (Vp-f characteristic), representing a frequency change in the vertical axis direction at the frequency compensation voltage shown in FIG. 4-2, where the lateral axis represents the frequency compensation voltage Vp, and the vertical axis represents the output frequency. In FIG. 5, the set values of the frequency compensation voltage Vp at the normal temperature, the low temperature, and the high temperature respectively are the voltages at the operation points $P_A$, $P_B''$, and $P_C''$ (corresponding to the operation points in FIG. 4-3). The frequency change amounts Δf (high temperature) and Δf (low temperature) in the vertical axis at each operation point correspond to the temperature drift amounts of the frequency at the high temperature and the low temperature respectively, and the frequency compensation voltage Vp is set to a direction opposite to the temperature drift direction. The temperature drift compensation range of the frequency (that is, the operation points $P_C''$, $P_A$, and $P_B''$) can be set optionally within the range of the frequency variation width of the frequency compensation voltage Vp. Therefore, the frequency variable zone other than the above can be used for adjusting the output frequency variation of the VCO 1 generated due to the manufacturing process and the individual variations, as explained above.

As described above, the oscillation frequency of the VCO can be adjusted to within an approximately constant range, by adjusting at each temperature the frequency compensation voltage V output from the frequency-correction-voltage generating unit 3, and by compensating for the temperature variation at the oscillation circuit side. Therefore, the temperature drift of the oscillation frequency of the VCO can be compensated for, and the modulation output can be obtained while keeping the legal frequency range of the Radio Law. Because the above frequency compensation function can permit the absolute frequency variation of the VCO within the range of the variable frequency width, yield degradation can be prevented.

Regarding the temperature characteristic of the semiconductor element constituting the VCO 1, characteristic of the semiconductor element 101 constituting the oscillation circuit unit 11 changes more than the characteristic of the varactor diodes 106 and 107 within the tuning circuit unit 12. The frequency temperature drift of the VCO having the configuration shown in FIG. 2 or FIG. 3 is generally approximately ruled by the temperature variation of the semiconductor element 101. Therefore, the temperature characteristic of the capacitance change of the varactor diodes 106 and 107 does not greatly depend on the oscillation characteristic of the VCO. Consequently, the modulation sensitivity of the VCO 1 (gradients of the $V_T$-f characteristic and the Vp-f characteristic) does not greatly change at temperatures. Accordingly, the gradients of the $V_T$-f characteristics B, C at the low temperature and the high temperature in FIG. 4-3 become approximately near to the gradient of the $V_T$-f characteristic A at the normal temperature.

Therefore, when the FM modulation voltage $V_T$ (center voltage $V_A$) having the same DC component as that at the normal temperature is given at the low temperature and the high temperature on approximately equal $V_T$-f characteristic curves by performing the above frequency temperature compensation, the FM modulation operation can be performed at the operation point of approximately equal modulation sensitivity. That is, a necessary frequency modulation width can be obtained at approximately a constant value of the FM modulation voltage $V_T$ (center voltage $V_A$, amplitude $\Delta V_A$) output from the FM-modulation-voltage generating unit 2 without depending on temperature.

The above description means that a measurement distance error can be substantially improved when the present modulation-signal generating circuit is applied to the radar device. For example, the measurement precision of the FM-CW radar and the like is proportional to the frequency modulation width $\Delta f$ of the transmission wave output from the modulation-signal generating circuit, and the frequency modulation width $\Delta f$ is proportional to the modulation sensitivity of the VCO. Therefore, when the modulation sensitivities at the low temperature and the high temperature are approximately equal to the modulation sensitivity at the normal temperature, approximately a constant measurement distance (error±several percents) can be obtained without depending on temperature. This error can be improved to about ± several percents at the low temperature to the high temperature, as compared with a measurement distance error −40% to +50% obtained from a change rate (+20 to +50°, at the low temperature, and −40 to −20% at the high temperature) to a normal-temperature modulation sensitivity at the low temperature and the high temperature when the VCO is operated at a conventional different gradient (modulation sensitivity) of the $V_T$-f characteristic.

In the present embodiment, the voltage control oscillator (hereinafter, VCO) having two variable impedance circuits capable of independently controlling the oscillation frequency is used. One variable impedance circuit is allocated to FM modulation, and the other variable impedance circuit is allocated to frequency compensation due to temperature variation. With this arrangement, temperature compensation of the output frequency of the VCO can be achieved independently of the FM modulation. That is, the oscillation frequency of the VCO can be adjusted to approximately a constant range, by adjusting the frequency compensation voltage output from frequency-correction-voltage generating unit according to the temperature T detected by the temperature monitoring unit, and by compensating for the temperature variation at the oscillation circuits side.

Further, in the present embodiment, temperature compensation of the output frequency of the VCO can be achieved independently of the FM modulation. The modulation operation point of the VCO does not need to be changed at each temperature due to the constraint of the legal frequency range of the Radio Law, and FM modulation can be performed at the operation point at which the modulation sensitivity of the VCO does not generally change at temperatures. That is, the frequency temperature drift of the VCO is compensated for at the frequency compensation voltage, and the FM operation is performed at the modulation voltage having a constant DC component not depending on temperature. With this arrangement, variation of the modulation sensitivity at temperatures can be overcome, temperature data of the modulation correction voltage to obtain modulation linearity of the output signal can be substantially simplified, and test and adjustment time can be substantially decreased. Further, a necessary frequency modulation width can be obtained at approximately a constant FM modulation voltage without depending on temperature.

Based on the frequency correction function, yield reduction due to the absolute frequency variation of the VCO changing at random for each manufacturing lot and process of semiconductors can be improved.

Second Embodiment

Figure 6:
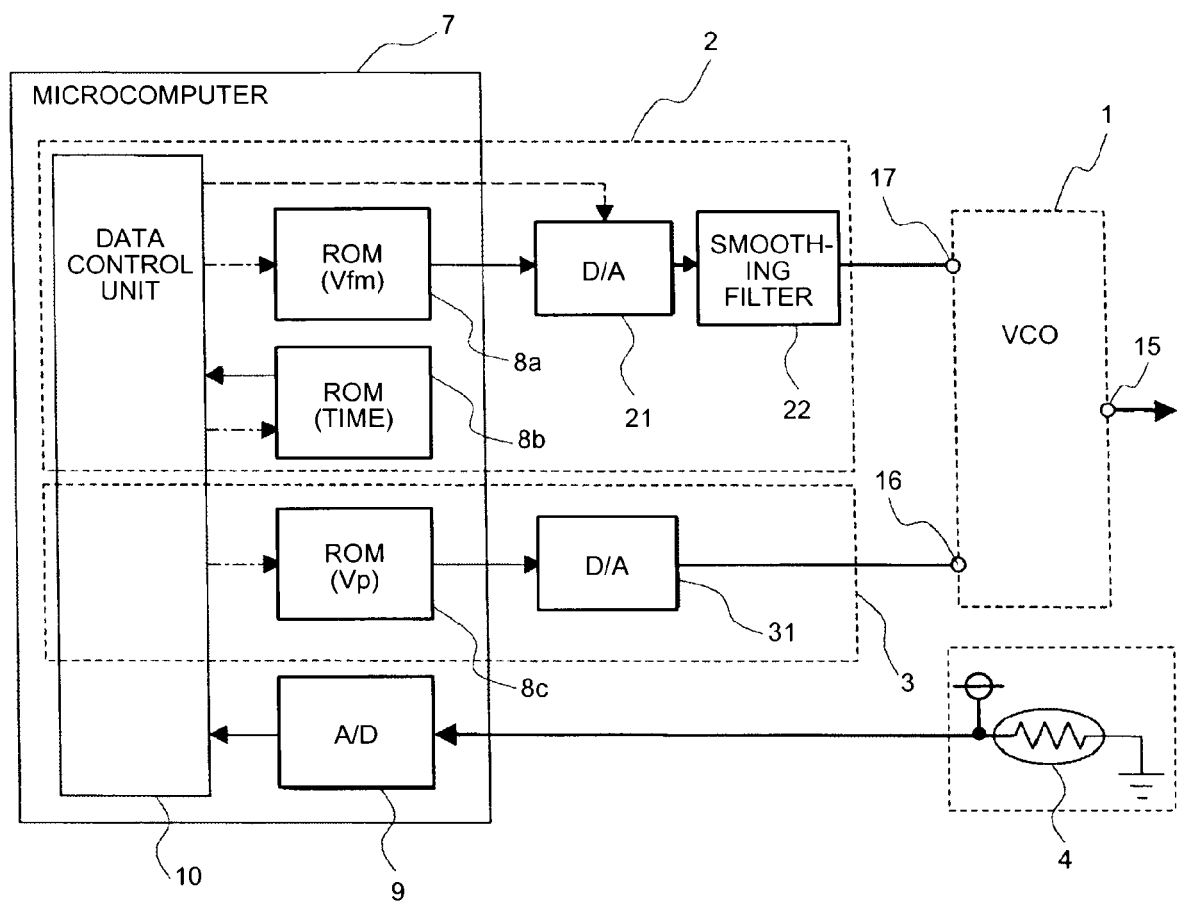
FIG. 6 is a block diagram of a circuit configuration of an FM-modulation-voltage generating unit and a frequency-correction-voltage generating unit of the modulation-signal generating circuit according to the present invention.

FIG. 6 is a block diagram of a circuit configuration of an FM-modulation-voltage generating unit and a frequency-correction-voltage generating unit of the modulation-signal generating circuit according to the present invention. A circuit configuration shown here is a configuration element of a generating unit of a voltage minimum necessary to control the VCO 1. A circuit configuration suitably changes according to needs, depending on a power supply voltage of the control circuit and a constraint of an output voltage range of each circuit, and the circuit configuration is not limited to the present configuration.

In the modulation-signal generating circuit shown in FIG. 6, the FM-modulation-voltage generating unit 2 generates an FM modulation voltage which periodically changes at a predetermined voltage width around a predetermined DC component, and inputs the FM modulation voltage to one frequency control terminal of the VCO. The frequency-correction-voltage generating unit 3 outputs a frequency compensation voltage to the other frequency control terminal, according to a casing temperature independently of the FM-modulation-voltage generating unit. The temperature monitoring unit 4 detects a casing temperature of the circuit. A microcomputer 7 incorporates memories (ROM) 8a to 8c, an A/D converter 9, and a data control unit 10.

The A/D converter 9 converts an electric signal from the temperature monitoring unit 4 into a digital signal. An FM-modulation-voltage D/A converter 21 converts a digital value into an analog value according to an output value of the memory 8a (modulation voltage memory). A voltage smoothing filter 22 smoothes a voltage waveform by blocking a high frequency component of the output of the FM-modulation-voltage D/A converter. A frequency-compensation-voltage D/A converter 31 converts a digital value into an analog value according to an output value of the memory 8c (frequency-correction voltage memory). The data control unit 10 generates a control signal to output address values of the memories 8a to 8c of data corresponding to the detected casing temperature, and generates a necessary trigger signal to the D/A converter 21.

Figures 1, 7:
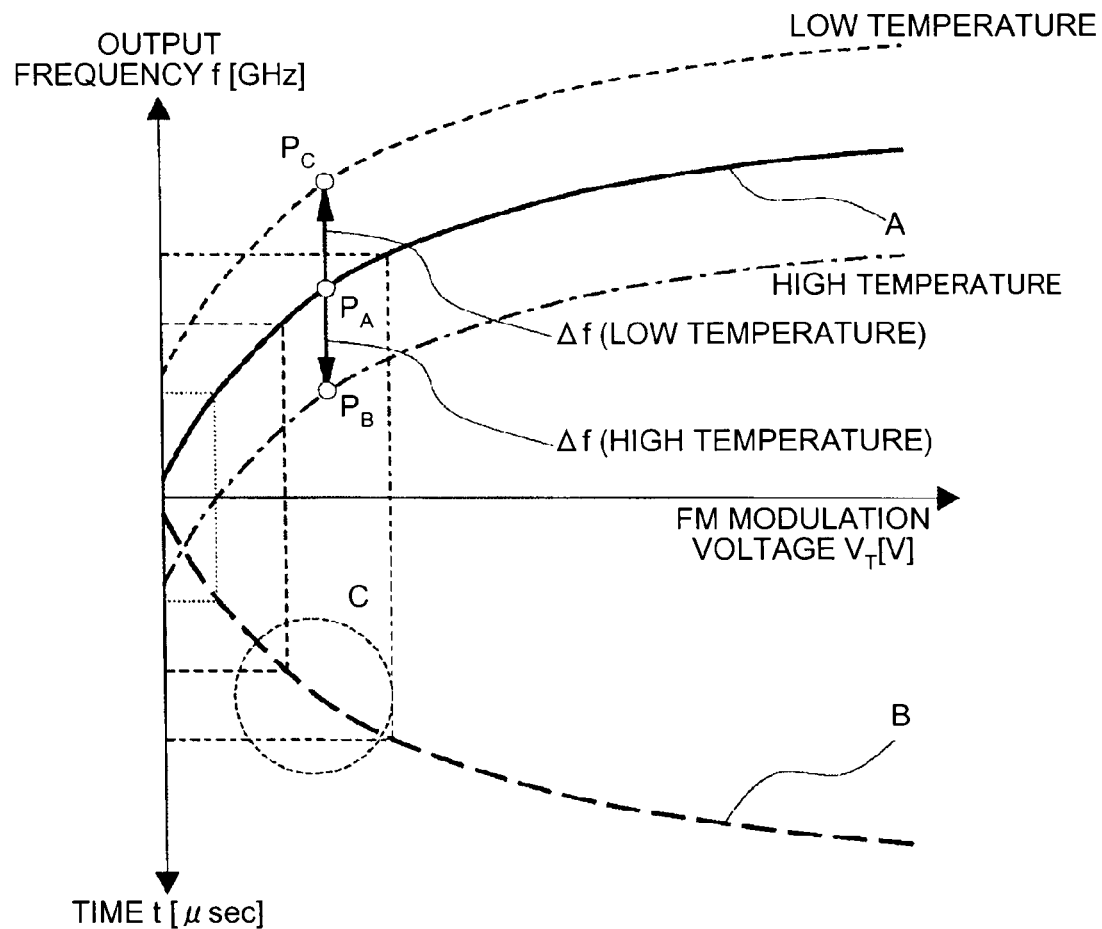
Figures 2, 7:
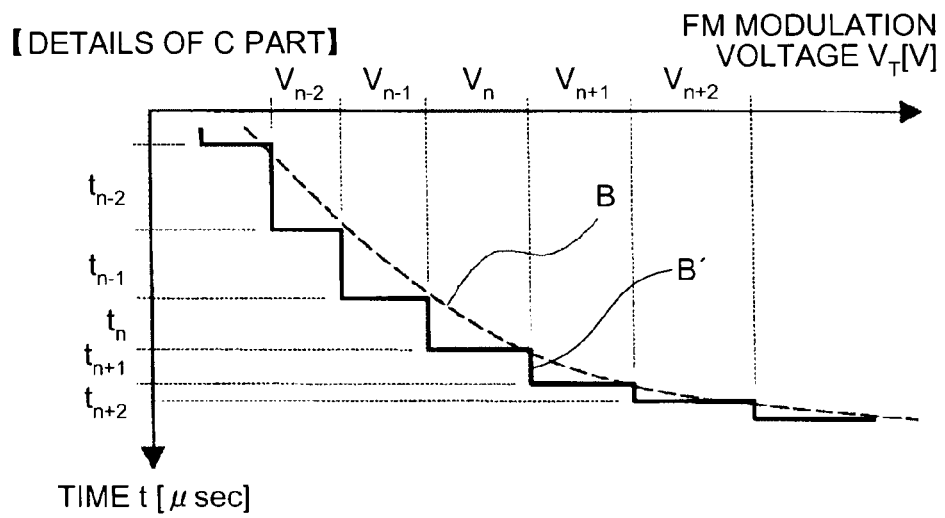

As shown in FIG. 7-1, the FM-modulation-voltage generating unit 2 outputs an FM modulation voltage (curve B) having an inverse gradient characteristic to the modulation voltage-output frequency characteristic (curve A) so that the output frequency of the VCO 1 linearly changes with time. The memory 8a incorporated in the microcomputer 7 stores FM-modulation voltage data (data of a discrete voltage value) at each temperature. On the other hand, as shown in the details of the C part in FIG. 7-2, the memory 8b (time memory) stores time interval data corresponding to each FM-modulation voltage output for controlling the output time of the FM modulation voltage (data of a discrete voltage value) within the memory 8a, so that the FM modulation voltage input to the FM-modulation-voltage D/A converter 21 smoothly approaches an ideal voltage (curve B in FIG. 7).

The data control unit 10 reads and outputs the FM-modulation voltage data within the memory 8a corresponding to the casing temperature detected by the temperature monitoring unit 4 via the A/D converter 9, and the address value of the time interval data within the memory 8b, and receives the time interval data from the memory 8b. Further, the data control unit 10 generates a timing signal based on the time interval data, and outputs a trigger signal to output the FM-modulation voltage data from the FM-modulation-voltage D/A converter 21. The memory 8a sets the FM modulation voltage corresponding to the address value from the data control unit 10, to the FM-modulation-voltage D/A converter 21. The FM-modulation-voltage D/A converter 21 outputs the set FM modulation voltage (solid line B' in FIG. 7-2), synchronously with the trigger signal from the data control unit 10. The voltage smoothing filter 22 removes sampling noise generated according to the output cycle of the frequency-compensation-voltage D/A converter 31.

Based on the above circuit configuration, a true FM-modulation voltage waveform (modulation target voltage waveform) can be realized by the FM-modulation voltage waveform (dotted line B) ideal for obtaining modulation linearity of the VCO 1, from the discrete FM-modulation voltage data within the memory 8a.

Figure 8:
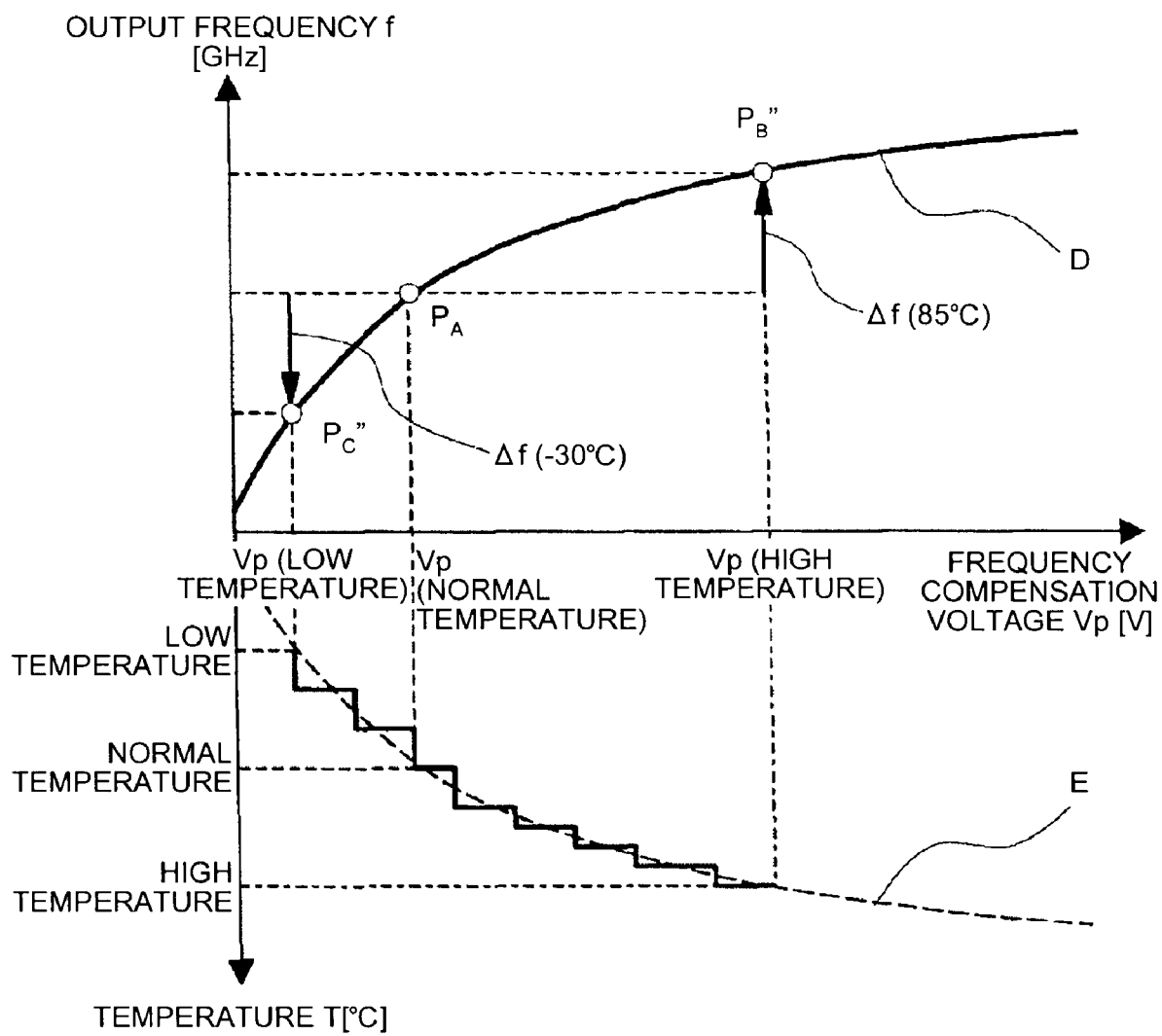
FIG. 8 is a graph of a relationship between a frequency-compensation voltage output-frequency characteristic (Vp-f characteristic) and a temperature-frequency compensation voltage to make an output frequency constant at temperatures, of a VCO according to the present invention.

The frequency-correction-voltage generating unit 3 outputs a frequency compensation voltage having an inverse gradient characteristic as shown by a curve E to the frequency-compensation voltage output-frequency characteristic (curve D) of the VCO 1 as shown in FIG. 8, so that the oscillation frequency of the VCO 1 becomes approximately constant at temperatures, as explained with reference to FIG. 4-2. That is, in the frequency compensation voltage Vp-output frequency f characteristic shown in FIG. 8, a frequency compensation voltage corresponding to operation points $P_B"$, and $P_C"$ at which frequency change amounts equivalent to the frequency drift amounts Δf (high temperature), Δf (low temperature) at the high temperature and the low temperature from the operation point $P_A$ at the normal temperature shown in FIG. 7 is obtained is output. The memory 8c incorporated in the microcomputer 7 stores frequency-compensation voltage data (discrete value) at each temperature. The data control unit 10 outputs an address value within the memory 8c corresponding to the above temperature, corresponding to the casing temperature detected by the temperature monitoring unit 4 via the A/D converter 9. The memory 8c sets the frequency-compensation voltage data corresponding to the address value from the data control unit 10, to the frequency-compensation-voltage D/A converter 31. The frequency-compensation-voltage D/A converter 31 outputs a set frequency compensation voltage from the memory 8c. Regarding the output timing control of the frequency-compensation-voltage D/A converter 31, a constant voltage (not a time waveform) corresponding to the temperature detected by the temperature monitoring unit 4 is output. Therefore, the output-time interval control and the waveform smoothing based on the time data performed by the FM-modulation-voltage generating unit 2 is not necessary. Although not shown in the drawing, output control is performed based on a predetermined data output cycle of modulation trigger and the like.

Figures 1, 9:
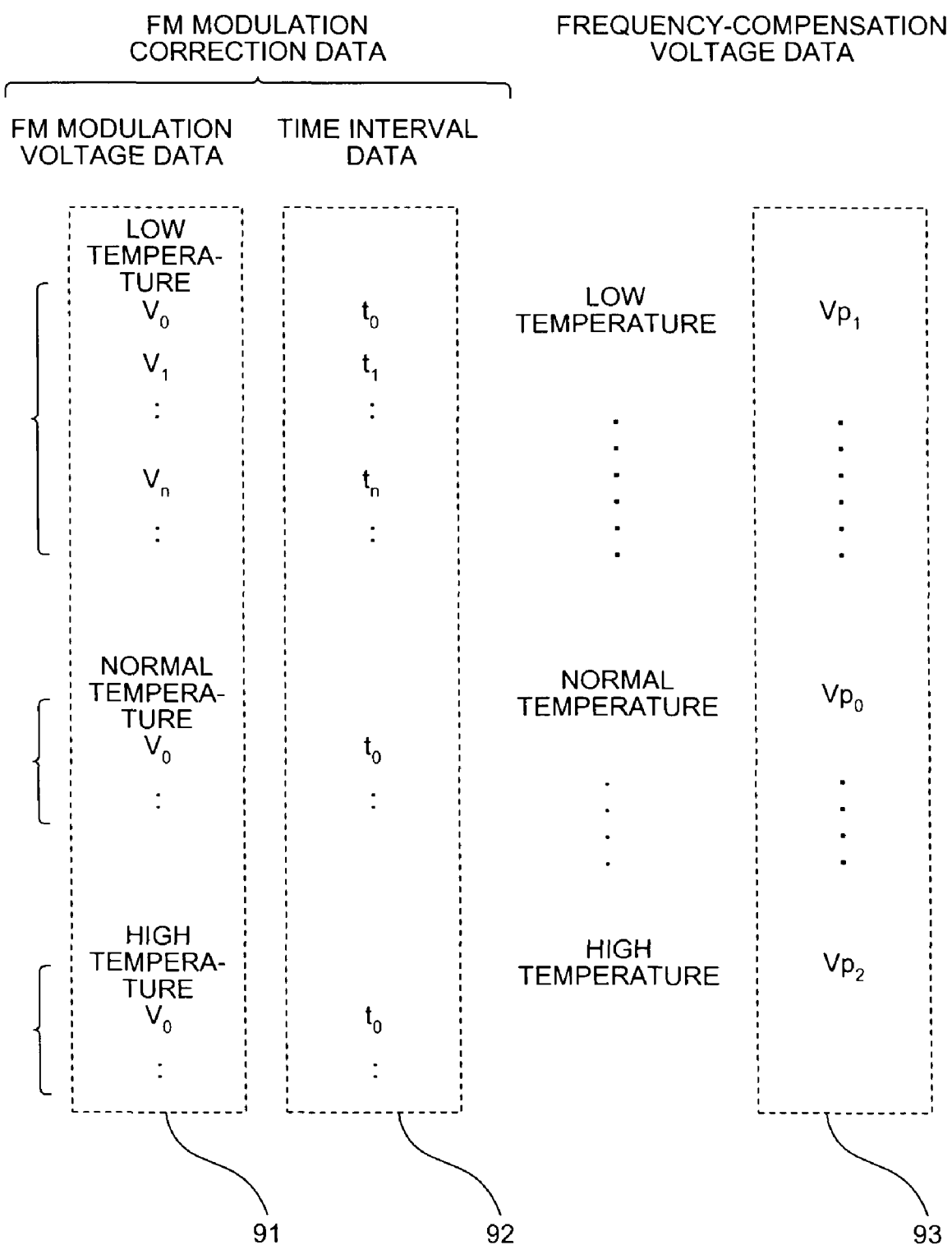
Figures 2, 9:
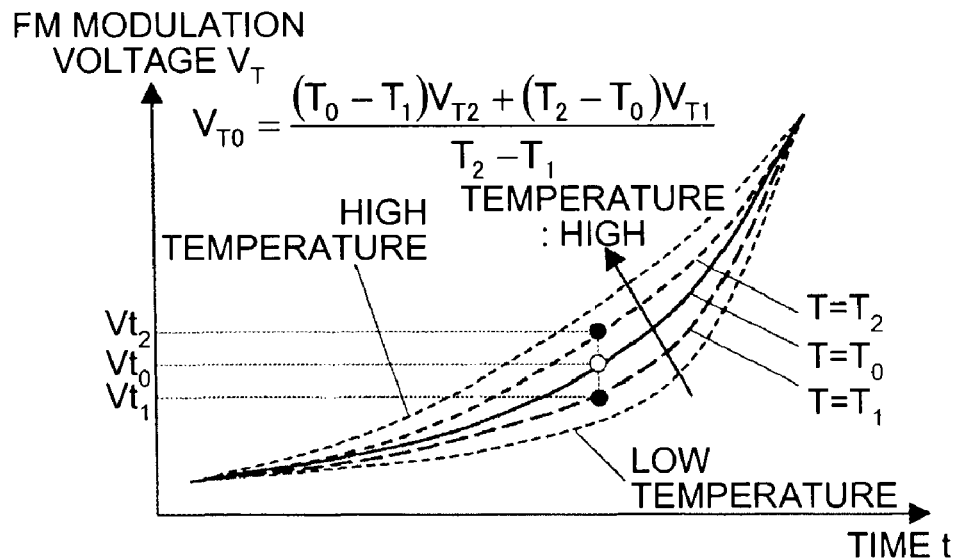
Figures 3, 9:
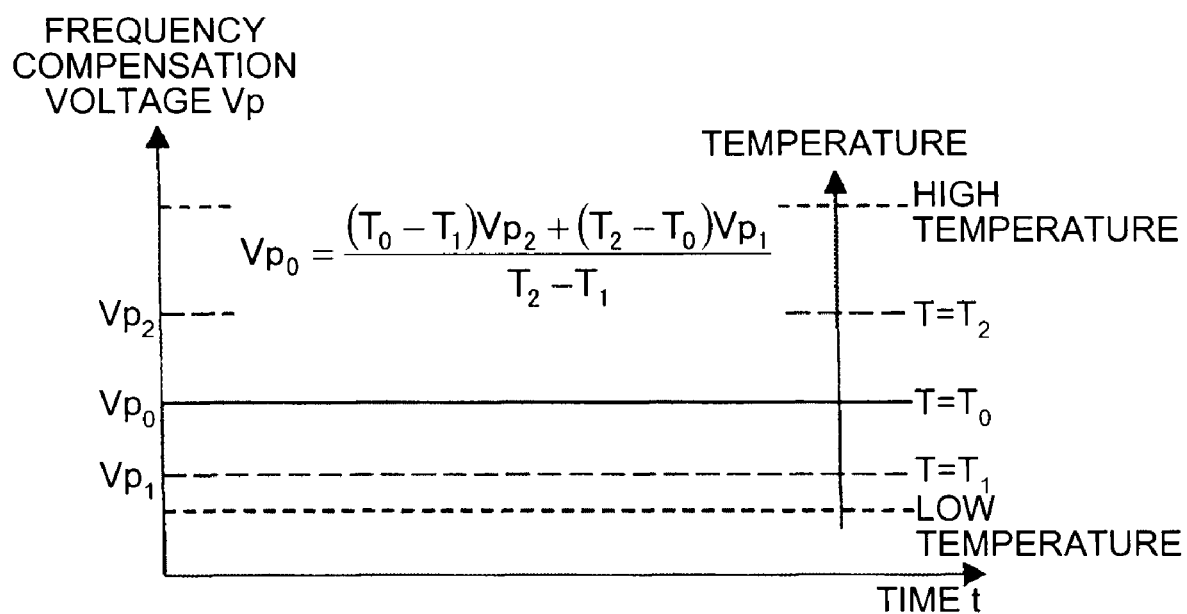

FIG. 9 are conceptual diagrams of waveforms at each control voltage of a temperature data table necessary at each temperature (FIG. 9-1), an FM modulation voltage $V_T$ (FIG. 9-2), and a frequency compensation voltage Vp (FIG. 9-3), stored in the memories 8a to 8c. Reference numeral 91 denotes FM-modulation voltage data, reference numeral 92 denotes time interval data, and reference numeral 93 denotes frequency-compensation voltage data.

The frequency-compensation voltage data Vp is stored in each temperature table, and FM-modulation voltage data $V_n$ and time interval data $t_n$ are stored in time series in each temperature table. The microcomputer 7 searches temperatures $T_n$ and $T_{n+1}$ nearest to the casing temperature T detected by the temperature monitoring unit 4, reads data corresponding to the temperatures $T_n$, $T_{n+1}$ from a predetermined address within the memories 8a to 8c, and interpolates linearly or by polynomial approximation from data of each temperature, thereby calculating and outputting an FM modulation voltage and a frequency compensation voltage corresponding to the casing temperature T. FIG. 9-2 and FIG. 9-3 are examples of voltage data (FM modulation voltage $V_T$ and frequency compensation voltage Vp) corresponding to a temperature $T_0$, calculated from temperatures $T_1$, $T_2$ by linear interpolation.

The above voltages can be also calculated from data at three or more temperatures other than the above, by polynomial approximation.

As described above, measurement distance precision of the FM-CW radar is proportional to the frequency modulation width Δf of the VCO 1. When it is attempted to suppress the measurement distance precision to equal to or lower than 1% by the correction voltage circuit at each of the above temperatures, a permissible error of the frequency modulation width becomes 1 megahertz in the FM-CW radar of modulation sensitivity 500 MHz/V and a frequency modulation width 100 megahertz of the VCO 1, for example. A necessary correction voltage is inversely proportional to the modulation sensitivity, and precision becomes equal to or lower than ±2 mV for a modulation voltage width 200 mVp-p. Based on the above circuit configuration and the correction data output system, a high-precision FM-correction modulation voltage can be obtained at each temperature.

Figure 10:
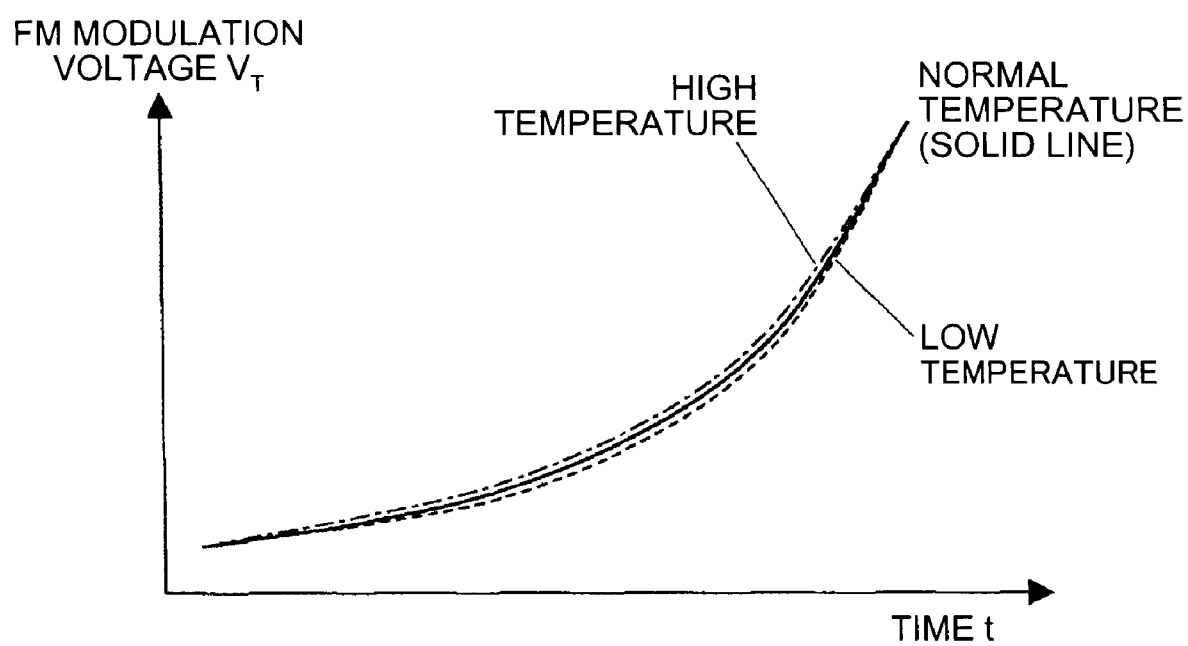
FIG. 10 is a graph of a time waveform of a VCO modulation voltage (correction voltage) according to the present invention.

Conventionally, the operation point of FM modulation needs to be shifted at each temperature due to the constraint of the Radio Law. Because modulation sensitivity at the low temperature and the high temperature greatly changes from the modulation sensitivity at the normal temperature as shown in FIG. 15-2, many temperature data tables are necessary by measuring and adjusting in advance the FM modulation voltage (modulation correction voltage) for correcting the temperature change of the modulation sensitivity. However, according to the present invention, FM modulation is performed at the same operation point at which modulation sensitivity of the VCO 1 does not generally change at each temperature as shown in FIG. 4. Therefore, necessary modulation-correction voltage data does not change greatly depending on temperatures. That is, modulation-correction voltage data requiring much data at each temperature as shown in the conceptual diagrams in FIG. 9 changes little at temperatures in the present invention as shown in FIG. 10. In the present invention, a high-precision frequency modulation output can be obtained with an extremely small amount of modulation-correction voltage data. Based on the above arrangement, the number of test temperatures can be decreased in obtaining each modulation-correction voltage data. As a result, tests and adjustment time can be decreased substantially.

Figures 1, 11:
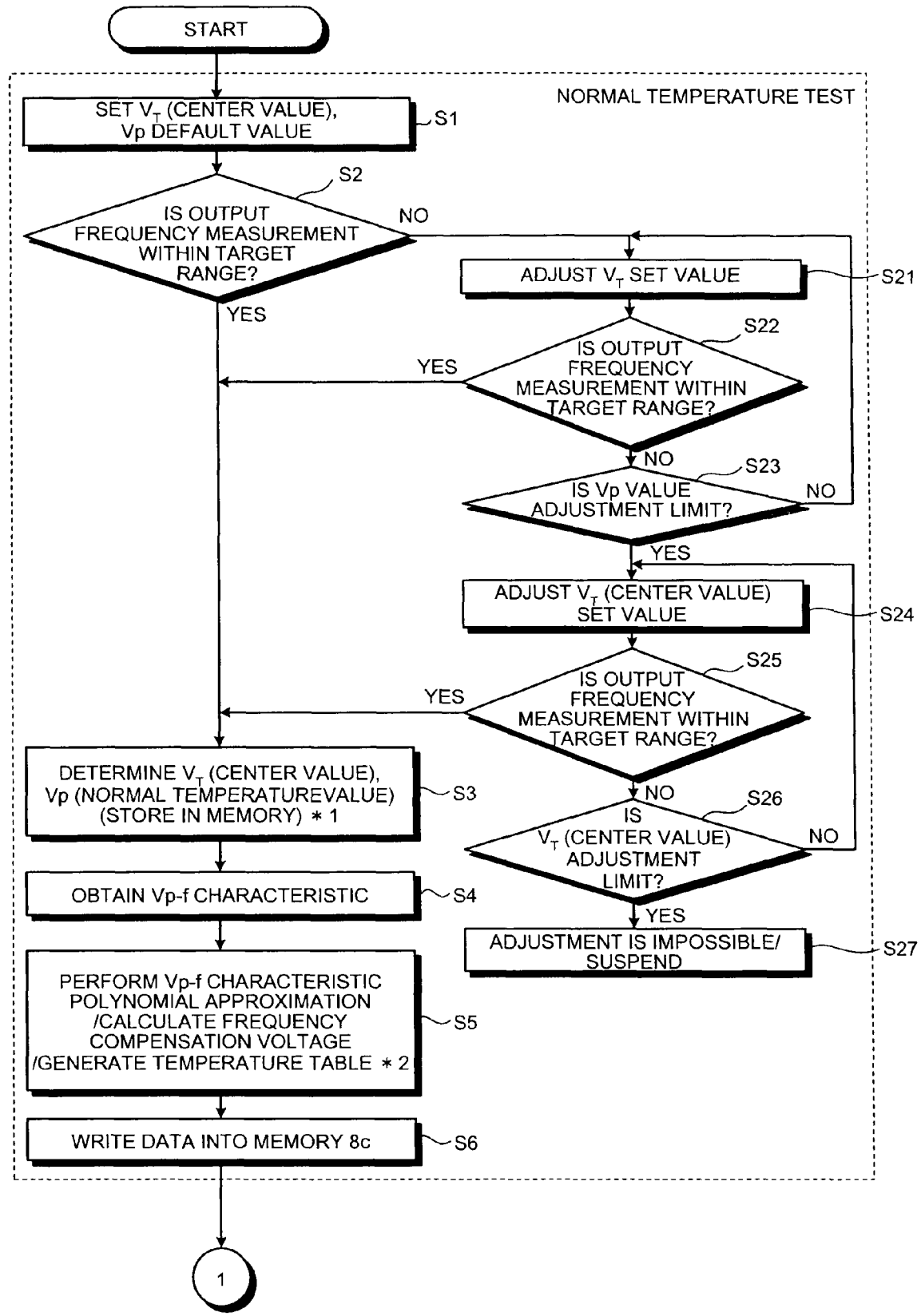
Figures 2, 11:
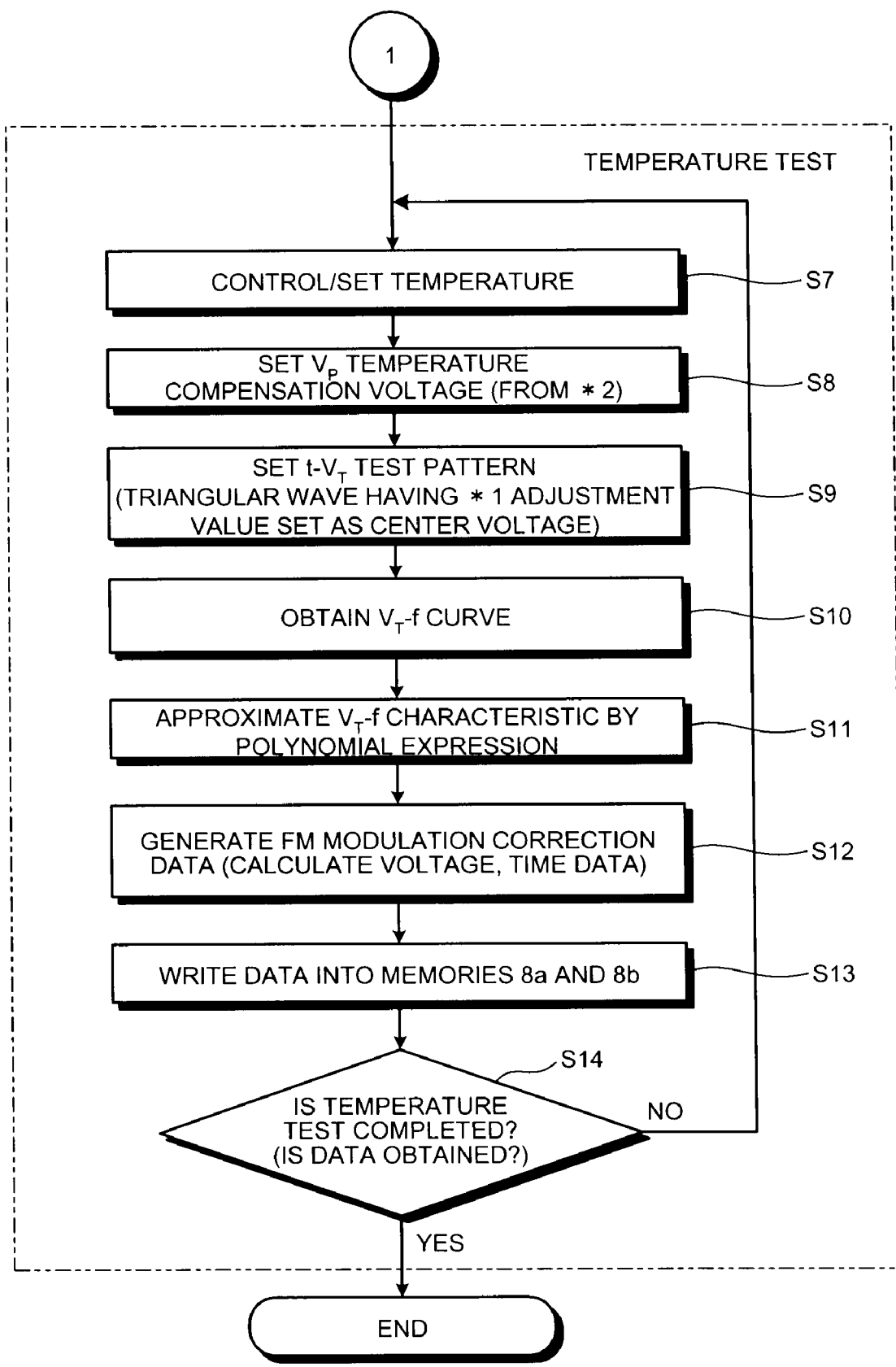

A generation flow of FM modulation data (hereinafter, modulation correction data) and frequency compensation data is explained next with reference to a flowchart of correction-data generation shown in FIG. 11.

As explained above, the output frequency of the modulation-signal generating circuit is determined by the FM modulation voltage (operation point center voltage) and the frequency compensation voltage. Therefore, each voltage at which the output frequency enters the legal frequency range at the normal temperature is first established. The frequency compensation voltage set at the normal temperature is set to a voltage value corresponding to a value near the center of the output-frequency change width obtained within the output voltage range, by considering the frequency compensation at the high temperature and the low temperature.

Next, a frequency-compensation voltage value at each temperature is determined (normal-temperature test), and last, FM-modulation compensation voltage data at each temperature is actually measured and calculated (temperature test).

A flow for determining a modulation correction voltage and a frequency compensation voltage at the normal temperature is explained below. First, the FM modulation voltage $V_T$ (center value) and an initial value (default value) of the frequency compensation voltage Vp are set, and the set values are input to each control terminal of the VCO 1 (Step S1). An output frequency of the modulation-signal generating circuit to this initial voltage is measured (Step S2). When the output frequency is within a target range, the initial voltage is set as a normal-temperature set value, and is held in the memory (Step S3). When the output frequency is not within a target range, the frequency compensation voltage Vp is adjusted within an adjustment limit range, and the output frequency is measured again (Steps S21 to S23). When the target frequency is not obtained within the Vp adjustment limit range, the FM modulation voltage $V_T$ is similarly adjusted in the adjustment limit range, and a frequency is measured again (Steps S24 to S26). When the target frequency is obtained at Step 22 and Step 25, the above VP, $V_T$ adjustment values are set as normal-temperature set values, and are stored in the memory (Step S3). When the target is not obtained, the output frequency of the VCO 1 does not enter the legal frequency range within the output range of each control voltage. Therefore, the adjustment cannot be performed and the process cannot proceed to the next process, and is suspended (Step S27). In the above process, normal-temperature set values of the FM modulation voltage $V_T$ (center value) and the frequency compensation voltage Vp are determined.

A flow for determining frequency-compensation voltage data at each temperature is explained in detail. First, the FM modulation voltage (operation point center voltage) is fixed (value held in the memory at step S3), and frequency compensation voltage-output frequency (Vp-f characteristic) data at the normal temperature (curve D in FIG. 8) is obtained (Step S4). This Vp-f characteristic has a gradient approximately close to the Vp-f characteristic A at the normal temperature, at the low temperature and the high temperature, as well, because of the same reason as that of the $V_T$-f characteristic described above. Therefore, a frequency change width at each temperature generally follows the above Vp-f characteristic at the normal temperature.

On the other hand, a rough range of the temperature drift amount of the output frequency compensated for by the above frequency compensation voltage is determined depending on the elements and the circuit configuration, and has little variation among individuals. A temperature gradient of the output of the VCO 1 obtained in advance is expressed as Δfd MHz/° C. For example, a temperature drift when the normal temperature To changes to the low temperature Tc is expressed as Δfd*(Tc-To). Therefore, the compensation voltage ΔVp at the low temperature is obtained from the curve D shown in FIG. 8. Similarly, the frequency compensation voltage at an optional temperature is calculated from the curve D, and is given as the curve D. The obtained characteristic is polynomially approximated to numerically derive the frequency compensation voltage (Step S5). A temperature table (FIG. 9) of the frequency compensation voltage at each temperature derived by the above process is written as data into the memory 8c (Step S6).

A flow for obtaining a modulation-correction voltage value at each temperature is explained next with reference to FIGS. 11-2. The modulation correction voltage requires a high-precision control as described above, and can be directly calculated from measurement data obtained at each temperature. The ambient temperature of the modulation-signal generating circuit is set (Step S7), and a frequency compensation voltage (*2) corresponding to a test temperature calculated in the above process is set (Step S8). By setting this voltage, the output frequency of the modulation-signal generating circuit is compensated for at a frequency at a temperature near the normal temperature. Next, a test voltage pattern (voltage linearly changing at a predetermined gradient along time) is input to the FM-modulation voltage terminal of the VCO 1 (Step S9). By measuring a time change of frequency, the $V_T$-f curve (curve A in FIG. 8) is obtained (Step S10). A range of the test voltage is the FM modulation voltage, having the first-determined FM modulation voltage (*1) set as the center voltage, and having amplitude at which the modulation frequency width ΔB necessary in the module can be output. Because the $V_T$-f curve can be expressed by polynomial expression, this can be given by Equation 1 when the curve is approximated by a two-dimensional expression (Step S11).

$$f = a*V^2 + b*V + c \quad \text{(Equation 1)}$$

When a center voltage (DC component) of the FM modulation voltage set at each temperature is expressed as $V_0$ (constant voltage not depending on temperature), a frequency output to this DC voltage is set as $f_0$, and a frequency change width Δf at an optional voltage based on this is given by Equation 2.

$$\Delta f = f - f_0 = a*(V^2 - V_0^2) + b*(V - V_0) \quad \text{(Equation 2)}$$

On the other hand, a corrected frequency (target t-f characteristic) changes periodically and linearly with time, and therefore, is given by Equation 3 to a cycle Tm, a modulation frequency width ΔB, and lower-limit frequency $f_L$.

$$f = (\Delta B/Tm)*t + f_L \quad \text{(Equation 3)}$$

Like Equation 2, when a frequency $f_0$ is obtained at time $t_0$, a frequency change width Δf at an optional time based on this is given by Equation 4.

$$\Delta f = f - f_o = (\Delta B/Tm)*(t - t_0) \quad \text{(Equation 4)}$$

From Equation 1 to Equation 4, a t-V characteristic (curve B in FIG. 7) given by Equation 5 necessary for the modulation correction is calculated.

$$t = t_o + \{a*(V^2 - V_0^2) + b*(V - V_0)\}/(\Delta B/Tm) \quad \text{(Equation 5)}$$

Equation 5 is a t-V relational expression to obtain an ideal target t-f characteristic. In obtaining this FM-modulation correction voltage at a discrete voltage Vn and a discrete time to stored in the memory, voltage and time data given by Equation 6 are calculated, in time series at a time interval $t_n - t_{n-1}$, where $V_0$ represents a DC component of the FM modulation voltage (constant voltage not depending on temperature), and $t_0$ (t=0) represents time (Step S12).

$$t_{-1} = t_0 + \{a*(V_{-1}^2 - V_0^2) + b*(V_{-1} - V_0)\}/(\Delta B/Tm)$$

$$t_0 = t_0$$

$$t_1 = t_0 + \{a*(V_1^2 - V_0^2) + b*(V_1 - V_0)\}/(\Delta B/Tm)$$

$$t_n = t_0 + \{a*(V_n^2 - V_0^2) + b*(V_n - V_0)\}/(\Delta B/Tm) \quad \text{(Equation 6)}$$

When the above time series data of $(V_n, t_n,)$ are stored in the memory (Step S13), and also when a correction voltage $V_n$ corresponding to each predetermined time interval $t_n - t_{n1}$ is output, a modulation correction voltage near Equation 5, that is, the curve B shown in FIG. 7, can be obtained. When the above process is performed at each temperature (Step S14→Step S7), modulation-correction voltage data in the category temperature range can be generated.

Next, a method of developing temperature data from the modulation correction data measured and generated in the above is explained. First, temperature data at three points of the low temperature, the high temperature, and the normal temperature including the category temperature range (modulation correction data and first-order and second-order coefficients of the approximate expression of the $V_T$-f curve given in Equation 1) are measured and obtained, based on the above flow. Next, the temperature data at the three points are developed into temperature data (12 temperatures, for example) to be stored in the memories 8a and 8b, by data interpolation from the three points. A process of developing the three temperature measurement data into 12 temperatures is explained as an example. First, from the first-order and second-order coefficients of the $V_T$-f curve approximate expression at the three points, first-order and second-order coefficients a and b of the $V_T$-f curve approximate expression of the remaining nine temperatures are calculated by linear or two-dimensional polynomial interpolation. Next, using the first-order and second-order coefficients calculated by the interpolation, modulation correction data (modulation correction voltage and time interval data) are calculated by Equation 3 and Equation 4, in a similar manner to that of measuring the three temperatures. The temperature data of the measurement three temperatures and the interpolation nine temperatures calculated in the above process (modulation correction voltage and time interval data) are stored in the memories 8a and 8b. The FM-modulation-voltage generating unit 2 interpolates the detected casing temperature from a data table of the above 12 temperatures, from the nearest two temperature data, by linear or polynomial approximation (see FIG. 9-2 and FIG. 9-3), thereby calculating and outputting the FM modulation voltage corresponding to the casing temperatures.

As explained above, the modulation-signal generating circuit according to the present invention performs interpolation without using coefficients other than the 0th order (intercept) of the $V_T$-f curve approximate expression, thereby performing high-precision temperature interpolation. That is, in Equation 1, coefficients equal to or higher than the first order represent gradients (modulation sensitivity) of the $V_T$-f curve. Equation 2 and Equation 4 lead a relationship between a modulation correction voltage and time, relative to the frequency change width. In the present invention, as described above, modulation sensitivity becomes approximately constant, by making constant the DC component of the FM modulation voltage. Therefore, approximately equal values of the coefficients a and b are obtained at each temperature. Consequently, sufficient precision can be obtained by temperature interpolation from measurement data of the three temperatures without using 0th order coefficient. On the other hand, when 0th order (intercept) is included, an expression based on the frequencies of Equation 1 and Equation 2 is obtained, that is, Equation 7 is obtained as a calculation expression, by setting the FM voltage giving a lower-limit frequency as $V_{min}$.

$$t=(a*V^2+b*V+c-f_L)/(\Delta B/Tm)$$

$$f_L=a*V_{min}^2+b*V_{min}+c \quad \text{(Equation 7)}$$

Equation 7 has an intercept of the 0th order coefficient (intercept) of the $V_T$-f curve approximate expression, to relate frequency to voltage. The 0th coefficient c has a larger error element than that of the coefficients a and b, due to the frequency temperature drift of the VCO and the temperature compensation at the frequency compensation voltage, and has an error element of the calculated time data.

Frequency-compensation voltage data for compensating for the temperature drift of the output frequency can be obtained from little measurement temperature data, and modulation-correction voltage data ideal for obtaining high-precision modulation linearity of the output signal can be obtained, based on the above FM modulation, the correction-data generation flow of the frequency compensation and the temperature interpolation method.

According to the above embodiment, variation of the modulation sensitivity at temperatures can be decreased, and the FM-modulation voltage waveform ideal for obtaining modulation linearity of the output signal can be generated using substantially little variation-correction voltage data, by compensating for the temperature drift of the output frequency and by performing FM operation at a modulation voltage having a constant DC component independent of temperature. Further, the number of test temperatures to obtain each correction data can be decreased, and the test and adjustment time can be decreased substantially.

Third Embodiment

Figure 12:
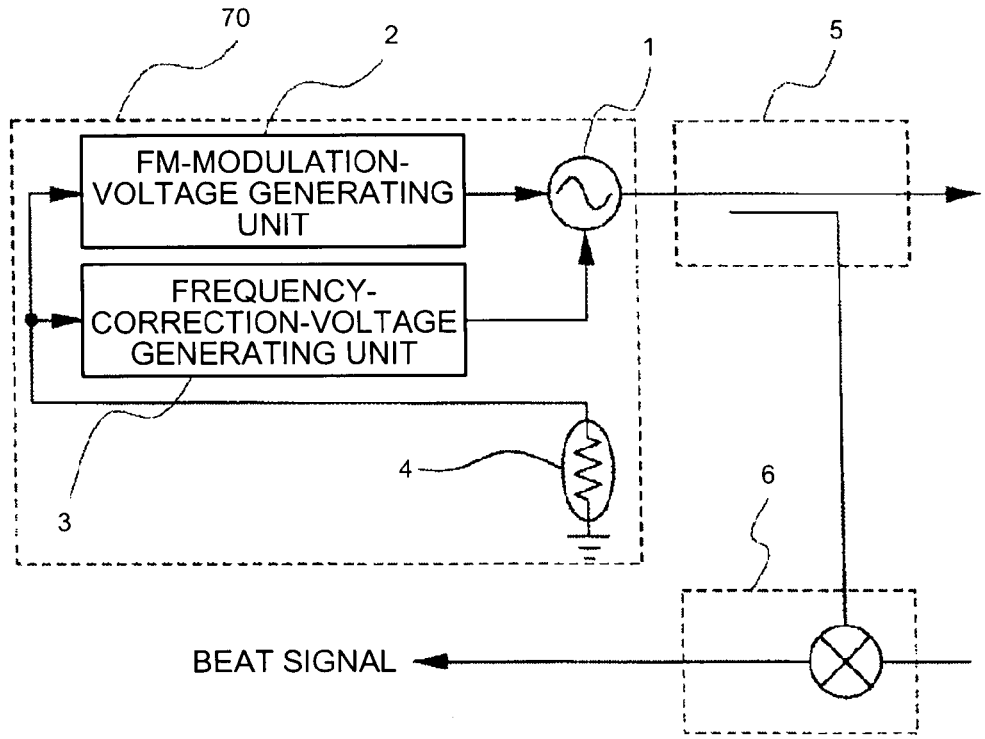
FIG. 12 is a block diagram of a basic configuration of a transmission/reception module according to a third embodiment of the present invention.

FIG. 12 is a block diagram of a basic configuration of a transmission/reception module according to a third embodiment of the present invention. The circuit configuration represents minimum necessary transmission/reception module constituent elements to extract a beat signal necessary for distance measurement and speed measurement in the radar device. Therefore, a circuit configuration suitably changes according to the necessity of a multiplier, a switch, an amplifier, etc., depending on the source oscillation frequency of the VCO, the number of transmission/reception channels, and radar performance, and the circuit configuration is not limited to the above configuration.

In the transmission/reception module shown in FIG. 12, reference numeral 70 denotes the modulation-signal generating circuit explained in the first or second embodiment of the present invention. The transmitting unit 5 transmits a signal output from the VCO 1, and branches a part of the transmission signal. The receiving unit 6 receives a reflection signal, and extracts a mixed wave of the reflection signal and a branch signal from the transmitting unit (hereinafter, a beat signal).

The modulation-signal generating circuit 70 compensates for the output frequency drift, and outputs the FM modulation wave having a predetermined modulation width, as explained in the first or second embodiment. This FM modulation wave is radiated to the external target object by the transmitting unit 5. The receiving unit 6 receives a reflection wave from the target object, mixes the reflection wave with the branched signal of the transmission signal, and obtains a beat signal.

According to the present embodiment, the modulation-signal generating circuit described in the first or second embodiment is used to compensate for a temperature drift of the transmission output frequency of the transmission/reception module, and can obtain the modulation output while keeping the legal frequency range of the Radio Law, thereby obtaining high-precision modulation linearity of the transmission output signal. Therefore, a transmission/reception module capable of obtaining a beat signal of high frequency stability having little error or time variation at temperatures can be configured.

Fourth Embodiment

Figure 13:
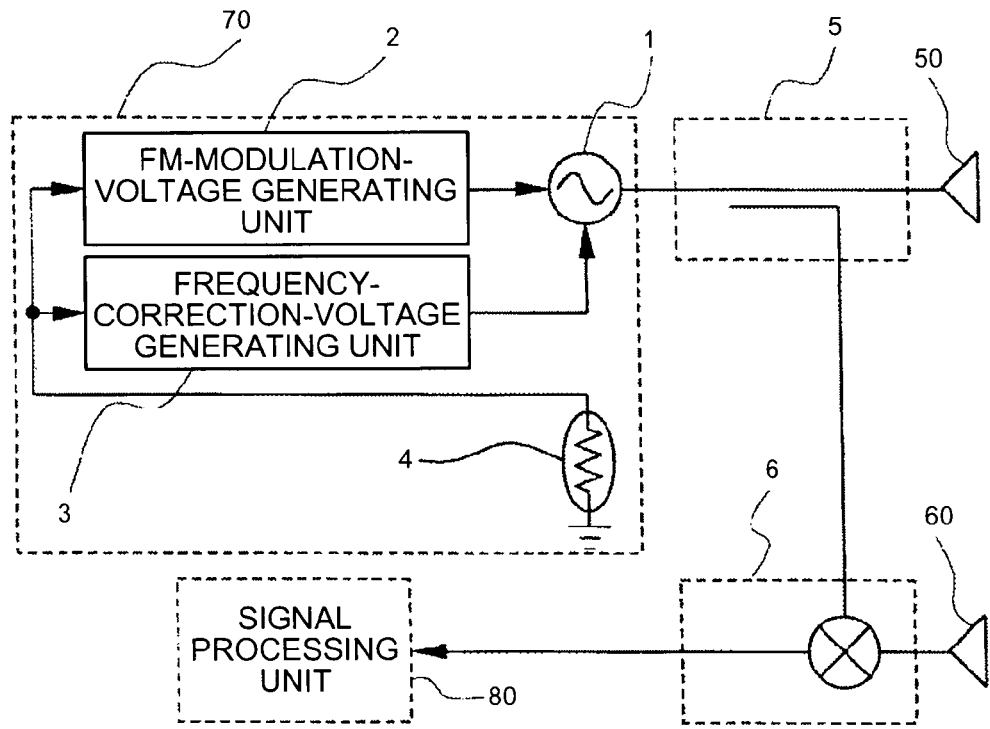
FIG. 13 is a block diagram of a basic configuration of a radar device according to the present invention.
Figure 14:
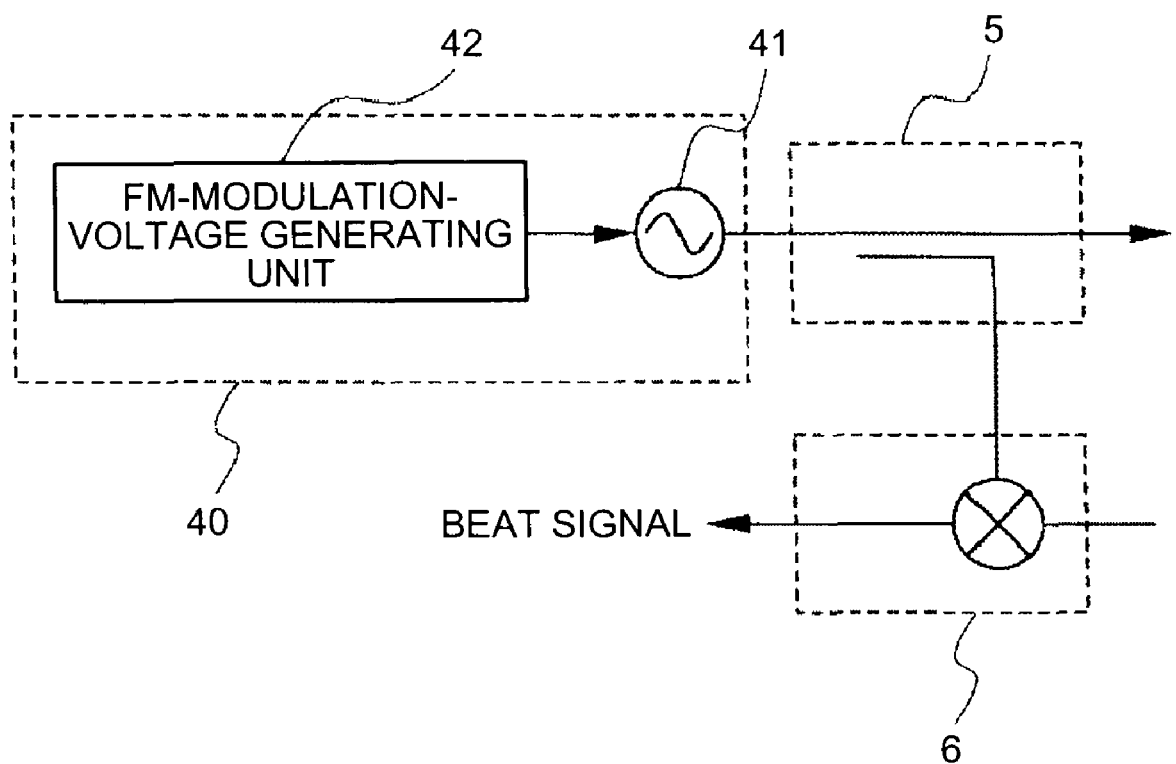
FIG. 14 is a block diagram of a basic configuration of a conventional transmission/reception module.

FIG. 13 is a block diagram of a basic configuration of a radar device according to a fourth embodiment of the present invention. In FIG. 13, reference numeral 70 denotes the modulation-signal generating circuit explained in the first or second embodiment of the present invention. The radar device includes the transmitting unit 5, the receiving unit 6, a transmission antenna 50, a receiving antenna 60, and a signal processing unit 80.

The modulation-signal generating circuit 70 compensates for the output frequency drift, and outputs the FM modulation wave having a predetermined modulation width. The transmitting unit 5 multiplies and amplifies this FM modulation wave according to needs, and emits the FM modulation wave from the transmission antenna 50 to the external target object.

A part of the transmission signal is branched to the receiving unit 6. The reception antenna 60 receives a reflection wave from the target object. The receiving unit 6 amplifies the reflection wave according to needs, and mixes the amplified reflection wave with the branched signal of the transmission signal, thereby obtaining a beat signal. The signal processing unit 80 extracts a delay time and a Doppler shift from the beat signal, thereby calculating a distance and a relative speed from the target object.

According to the present embodiment, the modulation-signal generating circuit described in the first or second embodiment is used as the modulation-signal generating circuit of the radar device, to obtain a modulation output while keeping the legal frequency range of the Radio Law, thereby obtaining high-precision modulation linearity of the transmission output signal. Therefore, a radar device having high distance-measurement precision and high speed-measurement precision with little error and little time variation at temperatures can be configured.

INDUSTRIAL APPLICABILITY

As described above, the modulation-signal generating circuit according to the present invention is useful for a distance-measurement and speed-measurement radar device such as an FM-CW radar device to which a microwave/millimeter-wave self-run oscillator having a large temperature drift of frequency is applied.

The invention claimed is:

1. A circuit for generating a modulation signal, comprising:
a temperature monitoring unit that detects an ambient temperature of the circuit;
a voltage control oscillator including a first variable impedance circuit and a second variable impedance circuit that independently control oscillation frequency of the voltage control oscillator based on an input control voltage;
a frequency-correction-voltage generating unit that outputs a voltage for compensating for a temperature drift of the oscillation frequency according to the ambient temperature, for the first variable impedance circuit; and
a frequency-modulation-voltage generating unit that outputs a modulation voltage containing a temperature-independent constant direct-current component and a predetermined alternate-current component, for the second variable impedance circuit, under a temperature drift compensation condition set by the frequency-correction-voltage generating unit.

2. The circuit according to claim 1, wherein the frequency-modulation-voltage generating unit performs a frequency modulation at an operation point at which frequency modulation voltage-output frequency characteristics of the voltage control oscillator are approximately constant within an operation temperature range.

3. The circuit according to claim 1, wherein
the frequency-correction-voltage generating unit includes:
a temperature-data memory that stores therein temperature data of a frequency compensation voltage for compensating for the temperature drift of the oscillation frequency,
a digital-to-analog converter that converts temperature data of a set frequency compensation voltage into an analog data, and
a data controller that controls the temperature-data memory to output temperature data corresponding to the ambient temperature to the digital-to-analog converter, and the frequency-modulation-voltage generating unit includes:
a modulation-voltage memory that stores therein, as time-series discrete voltage data in advance, a modulation target-voltage waveform for each temperature at which the oscillation frequency changes periodically and linearly with time,
a time memory that stores therein output time interval data of the time-series discrete voltage, and
a data control unit that reads out the output time interval data stored in the time memory corresponding to the ambient temperature, and controls the digital-to-analog converter to digital-to-analog-convert a discrete voltage output of the modulation-voltage memory based on the output time interval.

4. The circuit according to claim 3, wherein the frequency-modulation-voltage generating unit stores discrete temperature data calculated by performing a linear or a polynomial interpolation using modulation-correction temperature data calculated based on frequency modulation voltage-output frequency characteristics measured in advance at temperatures of at least three points containing an operation temperature range in the modulation voltage memory and the time memory, calculates the frequency modulation voltage by interpolating the discrete temperature data for the ambient temperature, and outputs a calculated FM modulation voltage.

5. A transmission/reception module that transmits and receives a frequency modulation wave, and outputs a beat signal from a mixed wave of a transmission wave and a reception wave, the transmission/reception module comprising:
a modulation-signal generating circuit including:
a temperature monitoring unit that detects an ambient temperature of the circuit,
a voltage control oscillator including a first variable impedance circuit and a second variable impedance circuit that independently control oscillation frequency of the voltage control oscillator based on an input control voltage,
a frequency-correction-voltage generating unit that outputs a voltage for compensating for a temperature drift of the oscillation frequency according to the ambient temperature, for the first variable impedance circuit, and
a frequency-modulation-voltage generating unit that outputs a modulation voltage containing a temperature-independent constant direct-current component and a predetermined alternate-current component, for the second variable impedance circuit, under a temperature drift compensation condition set by the frequency-correction-voltage generating unit.

6. The transmission/reception module according to claim 5, wherein the frequency-modulation-voltage generating unit performs a frequency modulation at an operation point at which frequency modulation voltage-output frequency characteristics of the voltage control oscillator are approximately constant within an operation temperature range.

7. The transmission/reception module according to claim 5, wherein
the frequency-correction-voltage generating unit includes:
a temperature-data memory that stores therein temperature data of a frequency compensation voltage for compensating for the temperature drift of the oscillation frequency,
a digital-to-analog converter that converts temperature data of a set frequency compensation voltage into an analog data, and
a data controller that controls the temperature-data memory to output temperature data corresponding to the ambient temperature to the digital-to-analog converter, and
the frequency-modulation-voltage generating unit includes:
a modulation-voltage memory that stores therein, as time-series discrete voltage data in advance, a modulation target-voltage waveform for each temperature at which the oscillation frequency changes periodically and linearly with time,
a time memory that stores therein output time interval data of the time-series discrete voltage, and
a data control unit that reads out the output time interval data stored in the time memory corresponding to the ambient temperature, and controls the digital-to-analog converter to digital-to-analog-convert a discrete voltage output of the modulation-voltage memory based on the output time interval.

8. The transmission/reception module according to claim 7, wherein the frequency-modulation-voltage generating unit stores discrete temperature data calculated by performing a linear or a polynomial interpolation using modulation-correction temperature data calculated based on frequency modulation voltage-output frequency characteristics measured in advance at temperatures of at least three points containing an operation temperature range in the modulation voltage memory and the time memory, calculates the frequency modulation voltage by interpolating the discrete temperature data for the ambient temperature, and outputs a calculated FM modulation voltage.

9. A radar device that transmits and receives a frequency modulation wave, and calculates a relative distance and a relative speed with respect to a target object by performing a signal processing of a beat signal from a mixed wave of a transmission wave and a reception wave, the radar device comprising:
a modulation-signal generating circuit including:
a temperature monitoring unit that detects an ambient temperature of the circuit,
a voltage control oscillator including a first variable impedance circuit and a second variable impedance circuit that independently control oscillation frequency of the voltage control oscillator based on an input control voltage,
a frequency-correction-voltage generating unit that outputs a voltage for compensating for a temperature drift of the oscillation frequency according to the ambient temperature, for the first variable impedance circuit, and
a frequency-modulation-voltage generating unit that outputs a modulation voltage containing a temperature-independent constant direct-current component and a predetermined alternate-current component, for the second variable impedance circuit, under a temperature drift compensation condition set by the frequency-correction-voltage generating unit.

10. The radar device according to claim 9, wherein the frequency-modulation-voltage generating unit performs a frequency modulation at an operation point at which frequency modulation voltage-output frequency characteristics of the voltage control oscillator is approximately constant within an operation temperature range.

11. The radar device according to claim 9, wherein
the frequency-correction-voltage generating unit includes:
a temperature-data memory that stores therein temperature data of a frequency compensation voltage for compensating for the temperature drift of the oscillation frequency,
a digital-to-analog converter that converts temperature data of a set frequency compensation voltage into an analog data, and
a data controller that controls the temperature-data memory to output temperature data corresponding to the ambient temperature to the digital-to-analog converter, and
the frequency-modulation-voltage generating unit includes:
a modulation-voltage memory that stores therein, as time-series discrete voltage data in advance, a modulation target-voltage waveform for each temperature at which the oscillation frequency changes periodically and linearly with time,
a time memory that stores therein output time interval data of the time-series discrete voltage, and
a data control unit that reads out the output time interval data stored in the time memory corresponding to the ambient temperature, and controls the digital-to-analog converter to digital-to-analog-convert a discrete voltage output of the modulation-voltage memory based on the output time interval.

12. The radar device according to claim 11, wherein the frequency-modulation-voltage generating unit stores discrete temperature data calculated by performing a linear or a polynomial interpolation using modulation-correction temperature data calculated based on frequency modulation voltage-output frequency characteristics measured in advance at temperatures of at least three points containing an operation temperature range in the modulation voltage memory and the time memory, calculates the frequency modulation voltage by interpolating the discrete temperature data for the ambient temperature, and outputs a calculated FM modulation voltage.

13. A circuit for generating a modulation signal, comprising:
a temperature monitoring unit that detects an ambient temperature of the circuit;
a voltage control oscillator including a first variable impedance circuit and a second variable impedance circuit that independently control oscillation frequency of the voltage control oscillator based on an input control voltage;
a frequency-correction-voltage generating unit that outputs a voltage for compensating for a temperature drift of the oscillation frequency according to the ambient temperature, for the first variable impedance circuit; and
a frequency-modulation-voltage generating unit that outputs a modulation voltage containing a temperature-independent constant direct-current component and a predetermined alternate-current component that is set in advance according to the ambient temperature for the second variable impedance circuit, under a temperature drift compensation condition set by the frequency-correction-voltage generating unit.

* * * * *

UNITED STATES PATENT AND TRADEMARK OFFICE
CERTIFICATE OF CORRECTION

| | |
|---|---|
| PATENT NO. | : 7,847,644 B2 |
| APPLICATION NO. | : 12/096951 |
| DATED | : December 7, 2010 |
| INVENTOR(S) | : Takuya Suzuki |

It is certified that error appears in the above-identified patent and that said Letters Patent is hereby corrected as shown below:

On the title page, Item (54), and column 1, in the specifications the title should read:

-- (54) MODULATION-SIGNAL GENERATING CIRCUIT, TRANSMISSION/RECEPTION MODULE, AND RADAR DEVICE --

Signed and Sealed this
Eighth Day of March, 2011

David J. Kappos
*Director of the United States Patent and Trademark Office*